(12) United States Patent
Miyake et al.

(10) Patent No.: US 8,730,220 B2
(45) Date of Patent: May 20, 2014

(54) DISPLAY DEVICE

(75) Inventors: Hiroyuki Miyake, Kanagawa (JP); Atsushi Umezaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1011 days.

(21) Appl. No.: 12/047,518

(22) Filed: Mar. 13, 2008

(65) Prior Publication Data

US 2008/0231617 A1   Sep. 25, 2008

(30) Foreign Application Priority Data

Mar. 21, 2007   (JP) .................................. 2007-073754

(51) Int. Cl.
*G06F 3/038*   (2013.01)
*G09G 5/00*   (2006.01)
*G09G 3/36*   (2006.01)

(52) U.S. Cl.
USPC ............. 345/208; 345/204; 345/214; 345/87; 345/94; 345/100

(58) Field of Classification Search
USPC .............................. 345/204, 208, 214, 87–104
See application file for complete search history.

(56) References Cited

U.S. PATENT DOCUMENTS

| | | | |
|---|---|---|---|
| 5,701,136 A | 12/1997 | Huq et al. | |
| 6,496,170 B1 * | 12/2002 | Yoshida et al. | 345/87 |
| 6,518,962 B2 * | 2/2003 | Kimura et al. | 345/211 |
| 6,578,962 B1 * | 6/2003 | Amir et al. | 351/209 |
| 6,774,398 B2 | 8/2004 | Jang et al. | |
| 7,002,545 B2 | 2/2006 | Osame | |
| 7,009,202 B2 | 3/2006 | Jang et al. | |
| 7,079,123 B2 * | 7/2006 | Shino et al. | 345/204 |
| 7,126,597 B2 * | 10/2006 | Shino et al. | 345/212 |
| 7,327,169 B2 | 2/2008 | Osame et al. | |
| 7,463,254 B2 | 12/2008 | Shino et al. | |
| 7,615,869 B2 | 11/2009 | Koo et al. | |
| 7,746,338 B2 | 6/2010 | Shino et al. | |

(Continued)

FOREIGN PATENT DOCUMENTS

| | | |
|---|---|---|
| EP | 0 731 441 A2 | 9/1996 |
| EP | 1 282 100 A2 | 2/2003 |

(Continued)

OTHER PUBLICATIONS

Lee, Y. et al, "16.2: Advanced TFT-LCD Data Line Reduction Method," SID 06 Digest, SID International Symposium Digest of Technical Papers, vol. XXXVII, 2006, pp. 1083-1086.

(Continued)

*Primary Examiner* — Ilana Spar
(74) *Attorney, Agent, or Firm* — Husch Blackwell LLP

(57) ABSTRACT

To provide a display device in which reliability of a driver circuit can be improved by suppressing shift of the threshold voltage of a TFT. The minimum power supply voltage that is optimal for driving a transistor used in the driver circuit is found by actually changing voltage applied to a gate of the transistor. Specifically, voltage that is output from an output circuit included in the driver circuit when a value of power supply voltage applied to a shift register is changed is monitored. Then, a value of the power supply voltage is found such that a value of the voltage output from the output circuit satisfies a value enough to operate a pixel portion, and the driver circuit is operated using the power supply voltage.

26 Claims, 17 Drawing Sheets

(56) References Cited

U.S. PATENT DOCUMENTS

| | | | |
|---|---|---|---|
| 7,978,187 B2* | 7/2011 | Nathan et al. | 345/204 |
| 2004/0070558 A1* | 4/2004 | Cok et al. | 345/76 |
| 2004/0207018 A1* | 10/2004 | Jang et al. | 257/347 |
| 2005/0173709 A1* | 8/2005 | Lee et al. | 257/79 |
| 2006/0208671 A1 | 9/2006 | Ozaki et al. | |
| 2007/0200840 A1* | 8/2007 | Clynes et al. | 345/204 |
| 2008/0062106 A1* | 3/2008 | Tseng | 345/92 |

FOREIGN PATENT DOCUMENTS

| | | |
|---|---|---|
| JP | 5-11272 | 1/1993 |
| JP | 8-263028 | 10/1996 |
| JP | 2003-131611 | 5/2003 |
| JP | 2004-86130 | 3/2004 |
| JP | 2004-326111 | 11/2004 |
| JP | 2006-258921 | 9/2006 |
| JP | 2007-18299 | 1/2007 |
| TW | 543145 B | 7/2003 |

OTHER PUBLICATIONS

Taiwanese Office Action re Application No. TW 97107662, dated Jan. 9, 2014.

* cited by examiner

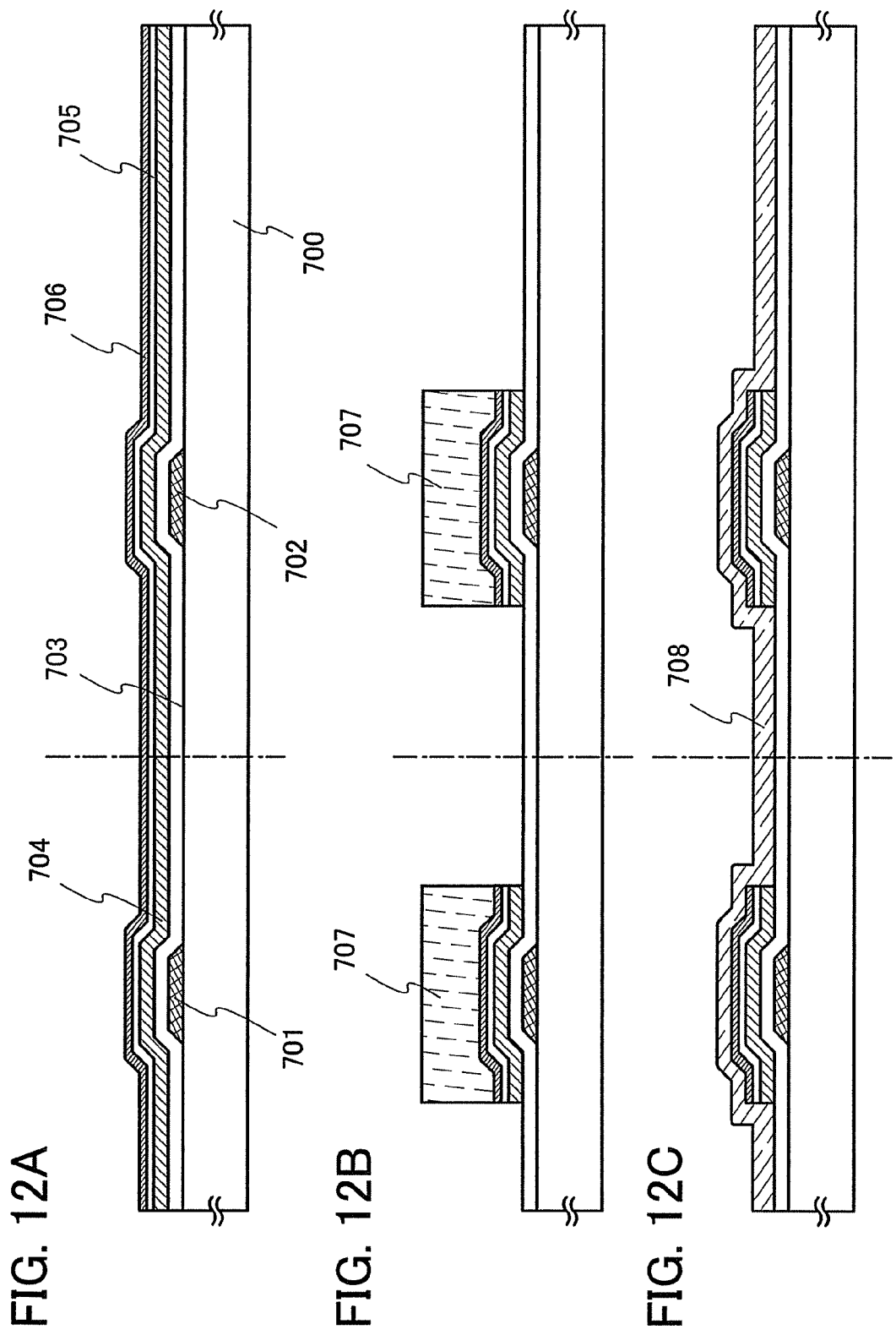

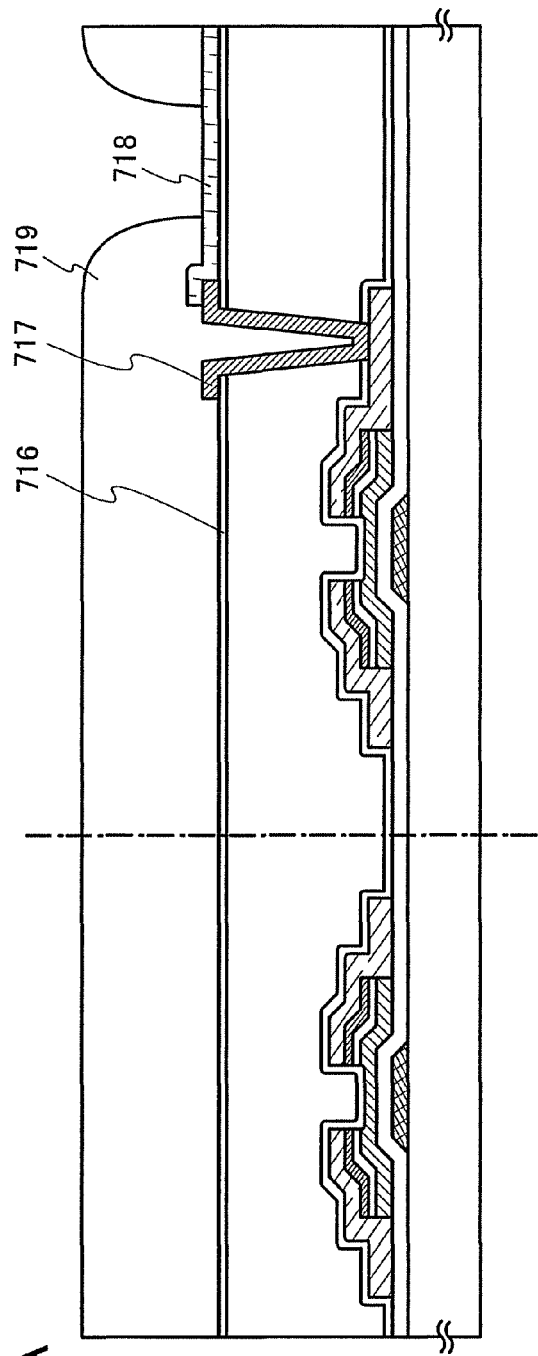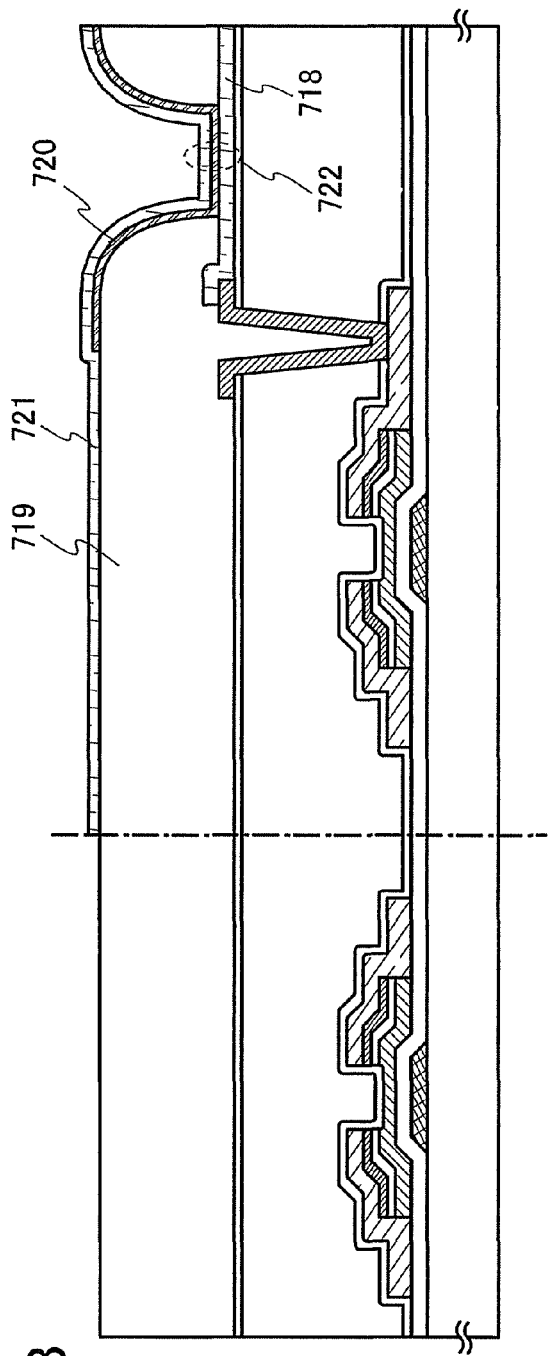
FIG. 14A
FIG. 14B

DISPLAY DEVICE

BACKGROUND OF THE INVENTION

1. Field of the Invention

The present invention relates to a display device using a thin film transistor.

2. Description of the Related Art

In a display device formed using an inexpensive glass substrate, a proportion of a region in the periphery of a pixel portion (a frame region), which is used for mounting, to a substrate is increased as resolution is increased; thus, reduction in size of the display device tends to be prevented. Therefore, it has been considered that a method in which a driver circuit formed using a single crystalline semiconductor substrate is mounted on a glass substrate has limitations, and a technique for forming a driver circuit and a pixel portion over the same glass substrate, that is, so-called system-on-panel has been emphasized. By realization of system-on-panel, the number of pins for connecting a driver circuit and a pixel portion can be reduced, and problems such as reduction in yield due to defective connection of a driver circuit and a pixel portion and low mechanical strength in a connection portion using pins, which have been caused when the driver circuit using a semiconductor substrate is mounted on a glass substrate, can be avoided. Further, by realization of system-on-panel, reduction in cost due to reduction in the number of assembly steps and inspection steps can be achieved in addition to reduction in size of the display device.

Typical driver circuits included in the display device are a scan line driver circuit and a signal line driver circuit. A plurality of pixels in one line (or in a plurality of lines in some cases) are selected by the scan line driver circuit. Input of a video signal to the pixel in the selected line is controlled by the signal line driver circuit.

As for the signal line driver circuit and the scan line driver circuit, driving frequency of the scan line driver circuit is easily suppressed as compared with that of the signal line driver circuit; thus, it can be said that the scan line driver circuit can be comparatively easily formed over a glass substrate. Reference 1 discloses a technique that a scan line driver circuit and a pixel portion are formed on a glass substrate with a transistor using an amorphous semiconductor (Reference 1: YongSoon Lee et al., "Advanced TFT-LCD Data Line Reduction Method", SOCIETY FOR INFORMATION DISPLAY 2006 INTERNATIONAL SYMPOSIUM DIGEST OF TECHNICAL PAPERS, Volume XXXVII, pp. 1083-1086, 2006).

SUMMARY OF THE INVENTION

A thin film transistor (TFT) using an amorphous semiconductor or a polycrystalline semiconductor has a lower capability of supplying current than a single crystalline transistor. Accordingly, in order to increase on current of a TFT used in a driver circuit, an insulating film such as a silicon nitride film or a silicon nitride oxide film which has a higher dielectric constant than that of silicon oxide is employed for a gate insulating film of the TFT in some cases.

Unfortunately, in a thin film transistor including a gate insulating film containing nitrogen, the threshold voltage tends to be largely shifted as an absolute value of voltage applied to a gate is increased and a period of time in an on state (driving time) is increased. This is because charge is trapped in the gate insulating film when voltage is applied to the gate. In particular, in a thin film transistor using an amorphous semiconductor, an insulating film containing nitrogen is often used as a gate insulating film, shift of the threshold voltage due to trapping of charge is a big problem.

FIG. 17A shows a general structure of an output circuit which is used in a scan line driver circuit and controls input of voltage to a scan line. The output circuit shown in FIG. 17A includes an n-channel transistor 3001 and an n-channel transistor 3002 which are connected in series. Voltage of a clock signal CLK is applied to a drain (D) of the transistor 3001. Power supply voltage VSS is applied to a source (S) of the transistor 3002. Voltage Vin1 is applied to a gate (G) of the transistor 3001. Voltage Vin2 is applied to a gate (G) of the transistor 3002. Voltage Vout of a node at which a source (S) of the transistor 3001 and a drain (D) of the transistor 3002 are connected is applied to the scan line.

FIG. 17B is a timing chart of voltages input to or output from the output circuit shown in FIG. 17A. As shown in FIG. 17B, the voltage Vin1 is at high level only during and right before and after a period in which one of pulses at high level of the clock signal CLK appears. When Vin1 becomes high level, the transistor 3001 is turned on. When Vin1 is at low level, the transistor 3001 is off.

On the other hand, the voltage Vin2 is at low level only during and right before and after the period in which one of the pulses at high level of the clock signal CLK appears. When Vin2 becomes low level, the transistor 3002 is turned off. When Vin2 is at high level, the transistor 3002 is on.

In the period during which the transistor 3001 is on and the transistor 3002 is off, the pulse at high level of the clock signal CLK is sampled and output as the voltage Vout. Then, the scan line is selected by the sampled pulse.

In the output circuit with the aforementioned structure, the transistor 3002 is kept on in a period during which the scan line is not selected. However, the period during which the scan line is not selected is much longer than a period during which the scan line is selected. Therefore, driving time of the transistor 3002 is much longer than that of the transistor 3001, and the threshold voltage tends to be shifted due to trapping of charge in a gate insulating film. When the threshold voltage is largely shifted, the transistor 3002 does not operate normally. Accordingly, trapping of charge in the gate insulating film is part of the reason for reduction in life of the scan line driver circuit.

In view of the foregoing problems, the invention is to provide a display device in which reliability of a driver circuit can be improved by suppressing shift of the threshold voltage of a TFT.

The inventors have found that voltage applied to a gate of a transistor used in a driver circuit is set to a minimum value in order to suppress shift of the threshold voltage of the transistor. Then, the inventors have proposed a structure to find minimum power supply voltage that is optimal for turning on the transistor by actually changing voltage applied to the gate of the transistor. Specifically, voltage that is output from an output circuit when a value of power supply voltage applied to a shift register is changed is monitored. Then, a value of the power supply voltage is found that a value of the voltage output from the output circuit satisfies a value enough to operate a pixel portion, and the driver circuit is operated using the power supply voltage.

An optimal value of the power supply voltage can be obtained at any time other than a period during which an image is displayed in the pixel portion. For example, the optimal value of the power supply voltage can be obtained in a period after a display device is turned on and until an image is actually displayed, or when display of an image stops for a while as appropriate.

In addition, a dummy output circuit that is used only for obtaining the optimal value of the power supply voltage and is not used for actual display may be provided. By using the dummy output circuit, the optimal value of the power supply voltage can be obtained at any time. That is, the optimal value of the power supply voltage can be obtained in a period during which scan lines are sequentially selected by a scan line driver circuit, or in a retrace interval which occurs after selection of the last scan line ends until selection of the first scan line starts.

In the invention, voltage applied to a gate of a transistor in a driver circuit is set to a minimum value, so that shift of the threshold voltage of the transistor can be suppressed. Accordingly, reliability of the driver circuit and thus reliability of a display device can be improved. In particular, in a thin film transistor using a thin amorphous semiconductor film, silicon nitride or silicon nitride oxide which has a higher dielectric constant than that of silicon oxide is often used for a gate insulating film in order to secure on current. When silicon nitride or silicon nitride oxide with a high dielectric constant is used, charge tends to be trapped, which leads to shift of the threshold voltage. With a structure of the invention, shift of the threshold voltage can be suppressed, and reliability of the display device can be improved.

BRIEF DESCRIPTION OF THE DRAWINGS

FIGS. 12A to 12C illustrate a manufacturing method of a display device of the invention.

FIGS. 14A and 14B illustrate a manufacturing method of a display device of the invention.

DETAILED DESCRIPTION OF THE INVENTION

Hereinafter, embodiment modes and embodiments of the present invention will be described with reference to drawings. Note that the present invention can be implemented in various modes, and it is easily understood by those skilled in the art that modes and details can be variously changed without departing from the scope and the spirit of the present invention. Therefore, the present invention is not construed as being limited to description of the embodiment modes and the embodiments.

Embodiment Mode 1

Figure 1A:
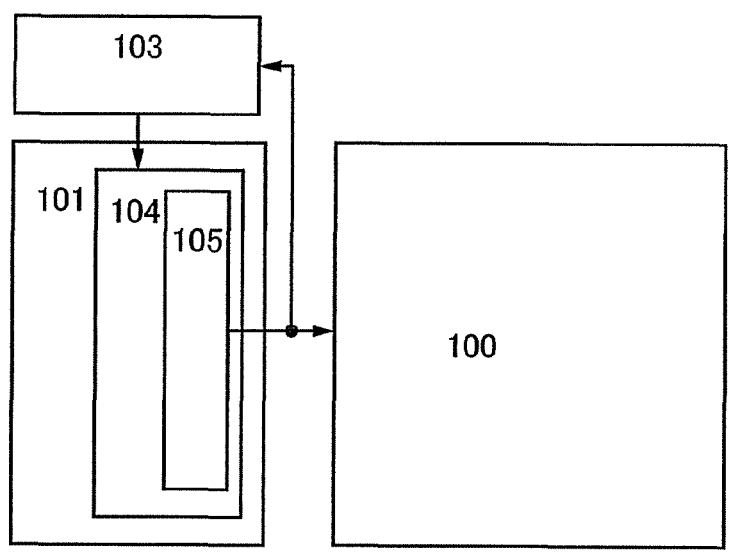
FIGS. 1A and 1B are block diagrams each showing a structure of a display device of the invention.
Figure 1B:
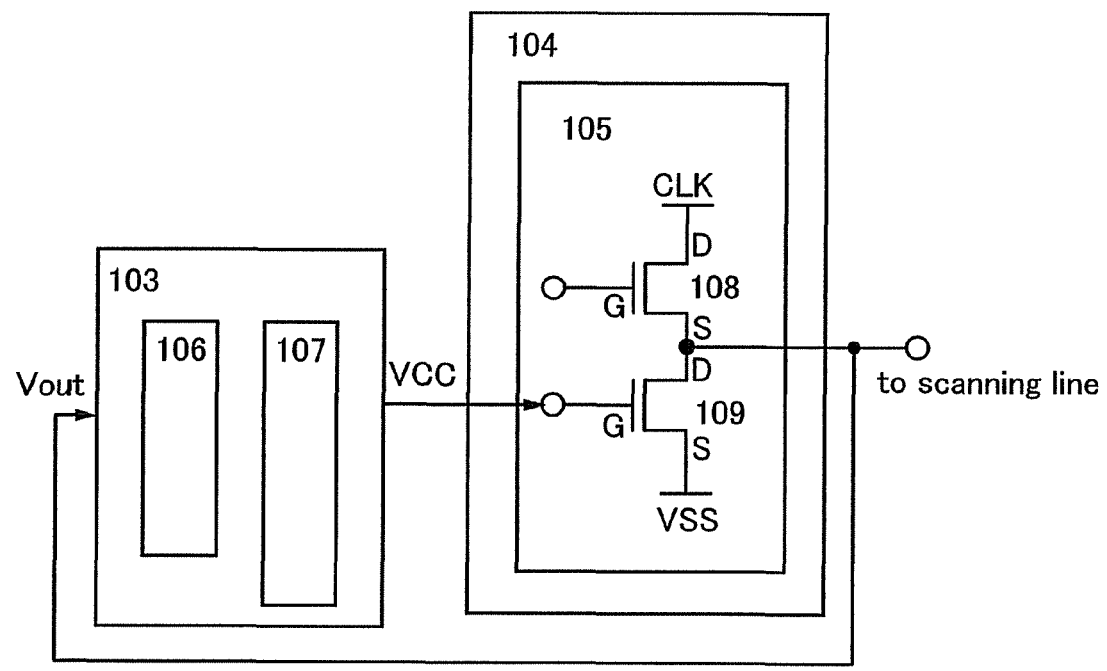

A structure of a display device of the invention is described with reference to FIGS. 1A and 1B. FIG. 1A is a block diagram of a display device of the invention. The display device of the invention includes a pixel portion 100, a scan line driver circuit 101, and a voltage generation circuit 103. Further, the display device of the invention may include a signal line driver circuit. A plurality of pixels are provided in the pixel portion 100. The pixels in each line are selected by the scan line driver circuit 101. The signal line driver circuit controls input of a video signal to the pixel in the line selected by the scan line driver circuit 101.

The scan line driver circuit 101 includes a shift register 104. The shift register 104 includes an output circuit 105. The shift register 104 selects a line by using a clock signal CLK and a start pulse signal SP input thereto. Specifically, by controlling switching of the output circuit 105 in accordance with the start pulse signal SP, the shift register 104 samples and supplies a pulse of the clock signal CLK to a scan line.

The case is described in which an n-channel transistor is used as a switching element in the pixel. When high-level voltage VDD of the pulse is applied to the scan line, the transistor is turned on, and pixels in the scan line are selected. When low-level voltage VSS is applied to the scan line, the transistor is turned off, and the pixels in the scan line are not selected.

Next, the case is described in which a p-channel transistor is used as a switching element in the pixel. When the low-level voltage VSS of the pulse is applied to the scan line, the transistor is turned on, and pixels in the scan line are selected. When the high-level voltage VDD is applied to the scan line, the transistor is turned off, and the pixels in the scan line are not selected.

Next, the case where an n-channel transistor is used as a switching element in the pixel is used as an example, and structures and operations of the voltage generation circuit 103, the shift register 104, and the output circuit 105 are described with reference to a block diagram shown in FIG. 1B. As shown in FIG. 1B, the voltage generation circuit 103 includes a decision circuit 106 and a voltage setting circuit 107.

The output circuit 105 includes at least two switching elements. Specifically, in the output circuit 105 shown in FIG. 1B, an n-channel transistor 108 and an n-channel transistor 109 are used as the switching elements. Note that FIG. 1B shows the case where both the transistors 108 and 109 are n-channel transistors; however, the invention is not limited to this structure. Both the transistors 108 and 109 may be p-channel transistors.

The transistors 108 and 109 are connected in series. Voltage of the clock signal CLK is applied to a drain (D) of the transistor 108. A source (S) of the transistor 108 is connected to the scan line. The voltage VSS is applied to a source (S) of the transistor 109. A drain of the transistor 109 is connected to the scan line. Accordingly, the clock signal CLK is sampled by the transistor 108, and application of the voltage VSS to the scan line is controlled by the transistor 109.

Specifically, the transistor 109 is turned on when voltage VCC among power supply voltages input to the output circuit 105 is applied to a gate of the transistor 109. In the voltage generation circuit 103, a value of the voltage VCC is changed by the voltage setting circuit 107. Then, the voltage VCC is input to the output circuit 105, and voltage Vout output from the output circuit 105 is monitored by the decision circuit 106.

Note that in order to prevent shift of the threshold voltage of the transistor 109, it is preferable that the voltage VCC be input to the output circuit 105 in order starting from a lower value, that is, a value closer to the voltage VSS when the transistor 109 is an n-channel transistor; and in order starting from a higher value, that is, a value closer to the voltage VDD when the transistor 109 is a p-channel transistor.

The decision circuit 106 decides whether the voltage Vout satisfies a value sufficient to operate the pixel portion. When the voltage Vout does not satisfy a sufficient value, it can be decided that the value of the voltage VCC is not high enough to turn on the transistor 109. On the other hand, when the voltage Vout satisfies a sufficient value, it can be decided that the value of the voltage VCC is high enough to turn on the transistor 109. With a series of operations described above, in the decision circuit 106, an optimal value of the voltage VCC, which is necessary for the voltage Vout to satisfy a value sufficient to operate the pixel portion, is found. Then, the voltage VCC is set to the above-described optimal value, and the voltage VCC is applied as power supply voltage to the shift register 104 when an image is actually displayed in the pixel portion 100.

Note that in order to make the operation of the shift register 104 more certain, in the voltage setting circuit 107, predetermined voltage may be added to the voltage VCC, which is decided as being optimal by the decision circuit 106, and the resulting voltage may be input as voltage VCC' to the shift register 104. The predetermined voltage to be added is preferably set in consideration of characteristics and reliability of a transistor in which shift of the threshold voltage is desired to be suppressed (the transistor 109 in this case) of the transistors in the output circuit 105.

In the shift register 104, switching of the output circuit 105 is controlled using the voltage VCC applied from the voltage generation circuit 103, the low-level voltage VSS, and the high-level voltage VDD. The voltage VCC or the voltage VSS is applied to the gate (G) of the transistor 109. The transistor 109 is switched so that it is on when the voltage VCC is applied to the gate and it is off when the voltage VSS is applied to the gate. Further, the voltage VDD or the voltage VSS is applied to a gate (G) of the transistor 108. The transistor 108 is switched so that it is on when the voltage VDD is applied to the gate and it is off when the voltage VSS is applied to the gate. Moreover, when the transistor 108 is on, the transistor 109 is off, whereas when the transistor 108 is off, the transistor 109 is on.

Since a period during which the scan line is not selected is much longer than a period during which the scan line is selected, driving time of the transistor 109 is much longer than that of the transistor 108. In the invention, as described above, the voltage VCC applied to the gate of the transistor 109 can be set to a minimum value as appropriate. Thus, trapping of charge in a gate insulating film can be suppressed, and shift of the threshold voltage of the transistor 109 can be suppressed. Accordingly, reliability of the scan line driver circuit 101 and thus reliability of the display device can be improved. In particular, in a thin film transistor using an amorphous semiconductor film, silicon nitride or silicon nitride oxide which has a higher dielectric constant than that of silicon oxide is often used for a gate insulating film in order to secure on current. When silicon nitride or silicon nitride oxide with a high dielectric constant is used, charge tends to be trapped, which leads to shift of the threshold voltage. With a structure of the invention, shift of the threshold voltage can be suppressed, and reliability of the display device can be improved.

In addition, even if the threshold voltage of the transistor 109 is shifted, a value of the voltage VCC is set each time so that the voltage Vout satisfies a value sufficient to operate the pixel portion; thus, the shift register can be surely operated. Accordingly, reliability of the driver circuit and thus reliability of the display device can be improved.

The optimal value of the power supply voltage VCC can be obtained at any time other than a period during which an image is displayed in the pixel portion 100. For example, the optimal value of the power supply voltage VCC can be obtained in a period after the display device is turned on and until an image is actually displayed, or when display of an image stops for a while as appropriate.

In addition, a dummy output circuit that is used only for obtaining the optimal value of the power supply voltage VCC and is not used for actual display may be provided. By using the dummy output circuit, the optimal value of the power supply voltage VCC can be obtained at any time. That is, the optimal value of the power supply voltage VCC can be obtained in a period during which scan lines are sequentially selected by the scan line driver circuit 101, or in a retrace interval which occurs after selection of the last scan line ends until selection of the first scan line starts.

In this embodiment mode, the case is described in which an n-channel transistor is used in the output circuit 105 and an n-channel transistor is used as the switching element of the pixel. Next, the case is considered in which a p-channel transistor is used in the output circuit 105 and a p-channel transistor is used as the switching element of the pixel. In this case, the voltage of the clock signal CLK is applied to the drain of the transistor 108. The source of the transistor 108 is connected to the scan line. The voltage VDD is applied to the source of the transistor 109. The drain of the transistor 109 is connected to the scan line. Accordingly, supply of the voltage VDD to the scan line is controlled by the transistor 109, and the clock signal CLK is sampled by the transistor 108. In order to turn off a transistor of the pixel, the transistor 109 in the output circuit 105 should be turned on, and the high-level voltage VDD should be applied to the scan line. Accordingly, since driving time of the transistor 109 is much longer than that of the transistor 108, a voltage generation circuit is provided so as to keep the voltage VCC in turning on the transistor 109 to a minimum value.

In this embodiment mode, the structure of the output circuit 105 in which the transistors 108 and 109 have the same polarity is described; however, the invention is not limited to this structure. The transistors 108 and 109 may have different polarities. In this case, since it is preferable that the voltage VDD be supplied to a source of a p-channel transistor and the voltage VSS be applied to a source of an n-channel transistor, the transistor 108 is preferably a p-channel transistor and the transistor 109 is preferably an n-channel transistor.

In this embodiment mode, the case is described in which each of the transistors 108 and 109 has a single-gate structure having one gate; however, the invention is not limited to this structure. A transistor with a multi-gate structure having a plurality of gates that are electrically connected to each other may be employed.

Embodiment Mode 2

In this embodiment mode, a specific structure of a voltage generation circuit used in the display device of the invention is described. A voltage generation circuit 200 shown in FIG.

2 includes a decision circuit 201, a voltage setting circuit 220, and an impedance converter 207. The voltage setting circuit 220 includes a controller 202, an adder 203, a counter 204, a switching circuit 205, and a digital-analog (DA) converter circuit 206.

Figure 2:
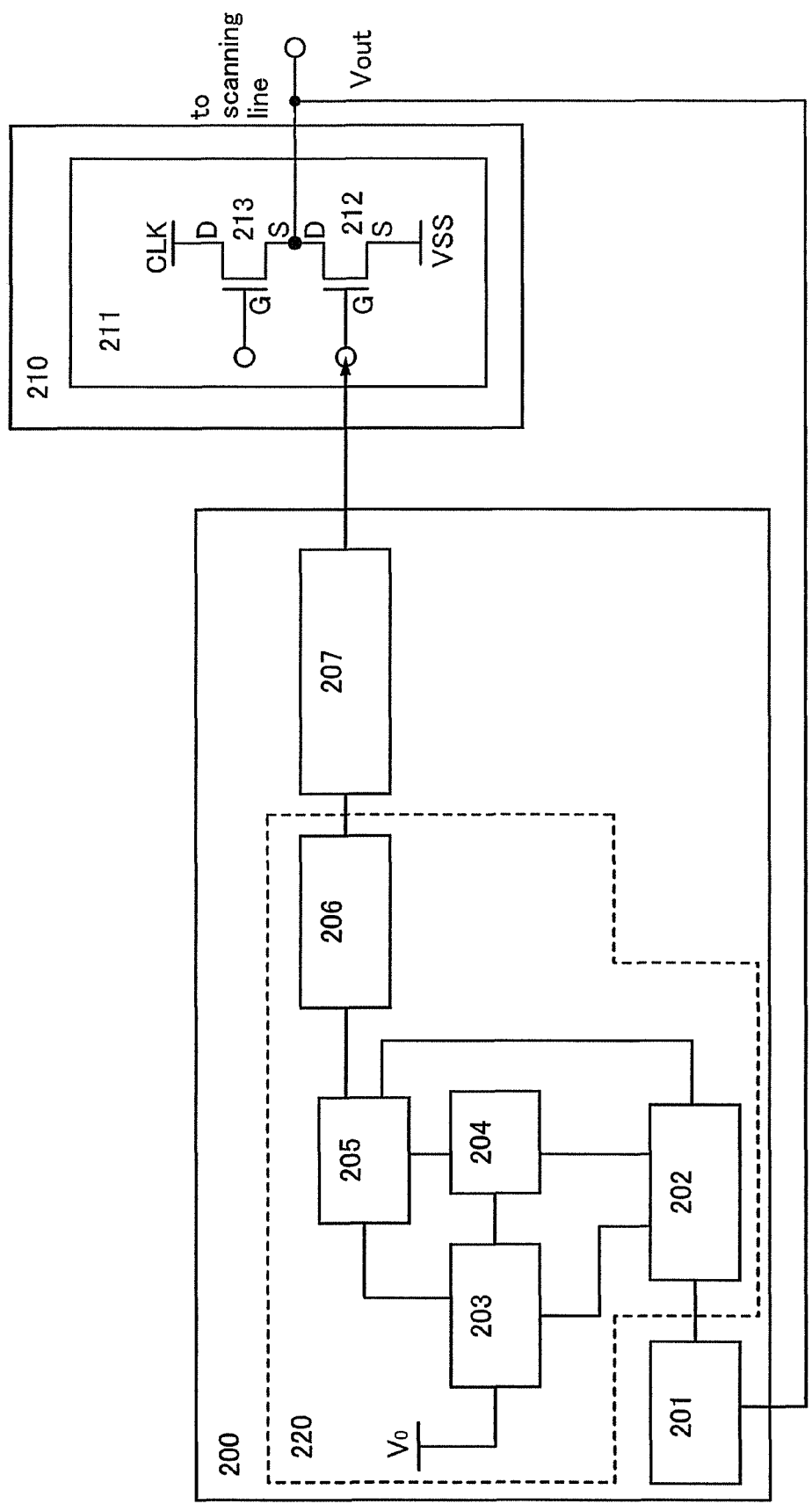
FIG. 2 is a block diagram showing a structure of a voltage generation circuit.

Note that in FIG. 2, the impedance converter 207 is provided on the output side of the voltage generation circuit 200. Although the impedance converter 207 is not necessarily provided, potential drop due to impedance of a shift register in the next stage can be suppressed with the aforementioned structure. For the impedance converter 207, a voltage follower can be used, for example.

Next, an operation of the voltage generation circuit 200 shown in FIG. 2 is described. In the voltage setting circuit 220, a value of the voltage VCC applied to a shift register 210 included in a scan line driver circuit is set. In this embodiment mode, a transistor 212 of an output circuit 211 is an n-channel transistor. In order to prevent shift of the threshold voltage of the transistor 212 of the output circuit 211, the voltage VCC is input from the voltage setting circuit 220 to the shift register 210 in order starting from a lower value, that is, a value closer to the voltage VSS. Note that when the transistor 212 is a p-channel transistor, the voltage VCC is preferably input to the shift register 210 in order starting from a higher value, that is, a value closer to the voltage VDD.

Specifically, in the voltage setting circuit 220, first, the controller 202 controls the counter 204 to output a signal whose state changes temporally. The signal output from the counter 204 is input to the DA converter circuit 206 through the switching circuit 205. In the DA converter circuit 206, voltage VCC having an analog value is generated in accordance with the signal input from the counter 204. Note that the value of the voltage VCC generated in the DA converter circuit 206 is changed from a lower value to a higher value in accordance with the signal from the counter 204, which changes temporally. The impedance converter 207 performs impedance conversion of the voltage VCC generated in the DA converter circuit 206 and outputs the resulting voltage to the shift register 210.

In the shift register 210, the transistor 212 of the output circuit 211 is switched in accordance with the voltage VCC which is input. When the voltage VCC is lower than the threshold voltage of the transistor 212, the transistor 212 is off; thus, the voltage VSS is not applied to a scan line, and the voltage Vout of the scan line does not satisfy a predetermined value, that is, a value sufficient to operate a pixel portion. However, as a value of the voltage VCC is sequentially increased, the voltage VCC becomes higher than the threshold voltage to some extent. Thus, the transistor 212 is turned on for the first time, so that the voltage VSS is applied to the scan line, and the voltage Vout of the scan line satisfies a predetermined value.

In the decision circuit 201, whether the voltage Vout output from the output circuit 211 satisfies a predetermined value or not is decided at any time that the voltage VCC changes, and transmits the result to the controller 202. When the voltage Vout satisfies the predetermined value, the controller 202 controls the switching circuit 205 and the counter 204, and transmits to the adder 203 a signal in which the value of the voltage VCC is included as information.

The adder 203 outputs a signal including information on voltage VCC' that is generated by adding predetermined voltage $V_0$ in expectation of shift of the threshold voltage to the voltage VCC when the voltage Vout satisfies the predetermined value. The signal including the information on the voltage VCC' is input to the DA converter circuit 206 through the switching circuit 205. In the DA converter circuit 206, voltage VCC' having an analog value is generated in accordance with the signal input thereto. The impedance converter 207 performs impedance conversion of the voltage VCC' generated in the DA converter circuit 206 and outputs the resulting voltage to the shift register 210.

In a period during which display is performed in the pixel portion, the voltage VCC' set in the voltage setting circuit 220 is applied as power supply voltage to the shift register 210. Of the transistor 212 and a transistor 213 in the output circuit 211, the voltage VCC' is applied to a gate of the transistor 212 in which shift of the threshold voltage is desired to be suppressed. By application of the voltage VCC' to the gate of the transistor 212, the voltage VSS can be applied as the voltage Vout to the scan line in a period during which the scan line is not selected.

Note that the value of the predetermined voltage $V_0$ added to the threshold voltage is preferably set in consideration of characteristics and reliability of a transistor in which shift of the threshold voltage is desired to be suppressed of the transistors in the output circuit.

In the invention, the voltage VCC applied to the gate of the transistor in which shift of the threshold voltage is desired to be suppressed of the transistors in the output circuit is set as appropriate to the minimum voltage VCC' depending on characteristics of the transistor 212 as described above. Thus, trapping of charge in a gate insulating film can be suppressed, and shift of the threshold voltage Vth of the transistor can be suppressed. Accordingly, reliability of the scan line driver circuit and thus reliability of the display device can be improved. In particular, in a thin film transistor using an amorphous semiconductor film, silicon nitride or silicon nitride oxide which has a higher dielectric constant than that of silicon oxide is often used for a gate insulating film in order to secure on current. When silicon nitride or silicon nitride oxide with a high dielectric constant is used, charge tends to be trapped, which leads to shift of the threshold voltage. With a structure of the invention, shift of the threshold voltage can be suppressed, and reliability of the display device can be improved.

This embodiment mode can be implemented in combination with the aforementioned embodiment mode.

Embodiment Mode 3

In this embodiment mode, another structure of a voltage generation circuit used in the display device of the invention, which is different from that in Embodiment Mode 2, is described. A voltage generation circuit 300 shown in FIG. 3 includes a decision circuit 301, a voltage setting circuit 320, and an impedance converter 307. The voltage setting circuit 320 includes a controller 302, an adder 303, a counter 304, and a digital-analog (DA) converter circuit 306.

Figure 3:
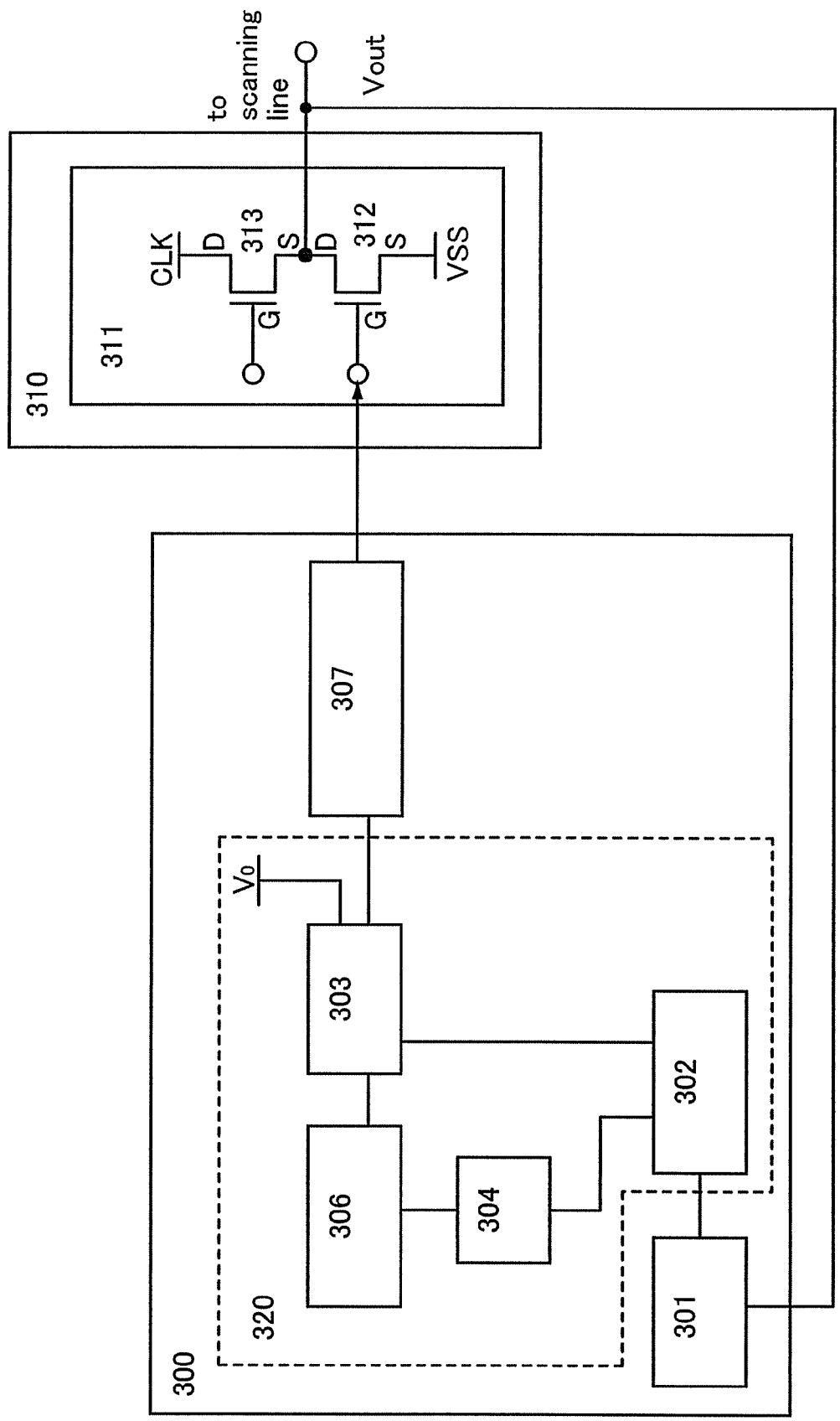
FIG. 3 is a block diagram showing a structure of a voltage generation circuit.

Note that in FIG. 3, the impedance converter 307 is provided on the output side of the voltage generation circuit 300. Although the impedance converter 307 is not necessarily provided, potential drop due to impedance of a shift register in the next stage can be suppressed with the aforementioned structure. For the impedance converter 307, a voltage follower can be used, for example.

Next, an operation of the voltage generation circuit 300 shown in FIG. 3 is described. In the voltage setting circuit 320, a value of the voltage VCC' applied to a shift register 310 included in a scan line driver circuit is set. In this embodiment mode, a transistor 312 of an output circuit 311 is an n-channel transistor. In order to prevent shift of the threshold voltage of the transistor 312 of the output circuit 311, the voltage VCC' is input from the voltage setting circuit 320 to the shift register 310 in order starting from a lower value, that is, a value closer to the voltage VSS. Note that when the transistor 312 is a p-channel transistor, the voltage VCC' is preferably input to the shift register 310 in order starting from a higher value, that is, a value closer to the voltage VDD.

Specifically, in the voltage setting circuit 320, first, the controller 302 controls the counter 304 to output a signal whose state changes temporally. The signal output from the counter 304 is input to the DA converter circuit 306. In the DA converter circuit 306, the voltage VCC having an analog value is generated in accordance with the signal input from the counter 304. Note that the value of the voltage VCC generated in the DA converter circuit 306 is changed from a lower value to a higher value in accordance with the signal from the counter 304, which changes temporally.

In the adder 303, voltage $V_0$ is added to the voltage VCC generated in the DA converter circuit 306. The voltage $V_0$ is extra voltage to be added in expectation of shift of the threshold voltage. The adder 303 adds the voltage $V_0$ to the voltage VCC and outputs the resulting voltage as the voltage VCC'. The impedance converter 307 performs impedance conversion of the voltage VCC' and outputs the resulting voltage to the shift register 310.

In the shift register 310, the transistor 312 of the output circuit 311 is switched in accordance with the voltage VCC' which is input. When the voltage VCC' is lower than the threshold voltage of the transistor 312, the transistor 312 is off; thus, the voltage VSS is not applied to a scan line, and the voltage Vout of the scan line does not satisfy a predetermined value, that is, a value sufficient to operate a pixel portion. However, as a value of the voltage VCC' is sequentially increased, the voltage VCC' becomes higher than the threshold voltage to some extent. Thus, the transistor 312 is turned on for the first time, so that the voltage VSS is applied to the scan line, and the voltage Vout of the scan line satisfies a predetermined value.

In the decision circuit 301, whether the voltage Vout output from the output circuit 311 satisfies a predetermined value or not is decided at any time that the voltage VCC' changes, and transmits the result to the controller 302. When the voltage Vout satisfies the predetermined value, the controller 302 controls the counter 304 and sets the value of the voltage VCC'.

Note that when whether the voltage Vout satisfies the predetermined value is decided in the decision circuit 301, voltage applied to the output circuit 311 is not the voltage VCC but the voltage VCC' obtained by adding the voltage $V_0$ to the voltage VCC. Accordingly, as an optimal value, it is preferable that voltage that is higher than the voltage VCC' at the time when the voltage Vout satisfies the predetermined value for the first time by the voltage $V_0$ in expectation of shift of the threshold voltage be set rather than the voltage VCC' at the time when the voltage Vout satisfies the predetermined value for the first time.

In a period during which display is performed in the pixel portion, the voltage VCC' set in the voltage setting circuit 320 is applied as power supply voltage to the shift register 310. Of the transistor 312 and a transistor 313 in the output circuit 311, the voltage VCC' is applied to a gate of the transistor 312 in which shift of the threshold voltage is desired to be suppressed. By application of the voltage VCC' to the gate of the transistor 312, the voltage VSS can be applied as the voltage Vout to the scan line in a period during which the scan line is not selected.

Note that the value of the predetermined voltage $V_0$ added to the threshold voltage is preferably set in consideration of characteristics and reliability of a transistor in which shift of the threshold voltage is desired to be suppressed of the transistors in the output circuit.

In the invention, the voltage VCC' applied to the gate of the transistor in which shift of the threshold voltage is desired to be suppressed of the transistors in the output circuit is set as appropriate to the minimum voltage VCC' depending on characteristics of the transistor 312 as described above. Thus, trapping of charge in a gate insulating film can be suppressed, and shift of the threshold voltage Vth of the transistor can be suppressed. Accordingly, reliability of the scan line driver circuit and thus reliability of the display device can be improved. In particular, in a thin film transistor using an amorphous semiconductor film, silicon nitride or silicon nitride oxide which has a higher dielectric constant than that of silicon oxide is often used for a gate insulating film in order to secure on current. When silicon nitride or silicon nitride oxide with a high dielectric constant is used, charge tends to be trapped, which leads to shift of the threshold voltage. With a structure of the invention, shift of the threshold voltage can be suppressed, and reliability of the display device can be improved.

This embodiment mode can be implemented in combination with the aforementioned embodiment modes.

Embodiment Mode 4

In this embodiment mode, a detailed structure and an operation of a decision circuit included in a semiconductor device of the invention are described.

Figure 4:
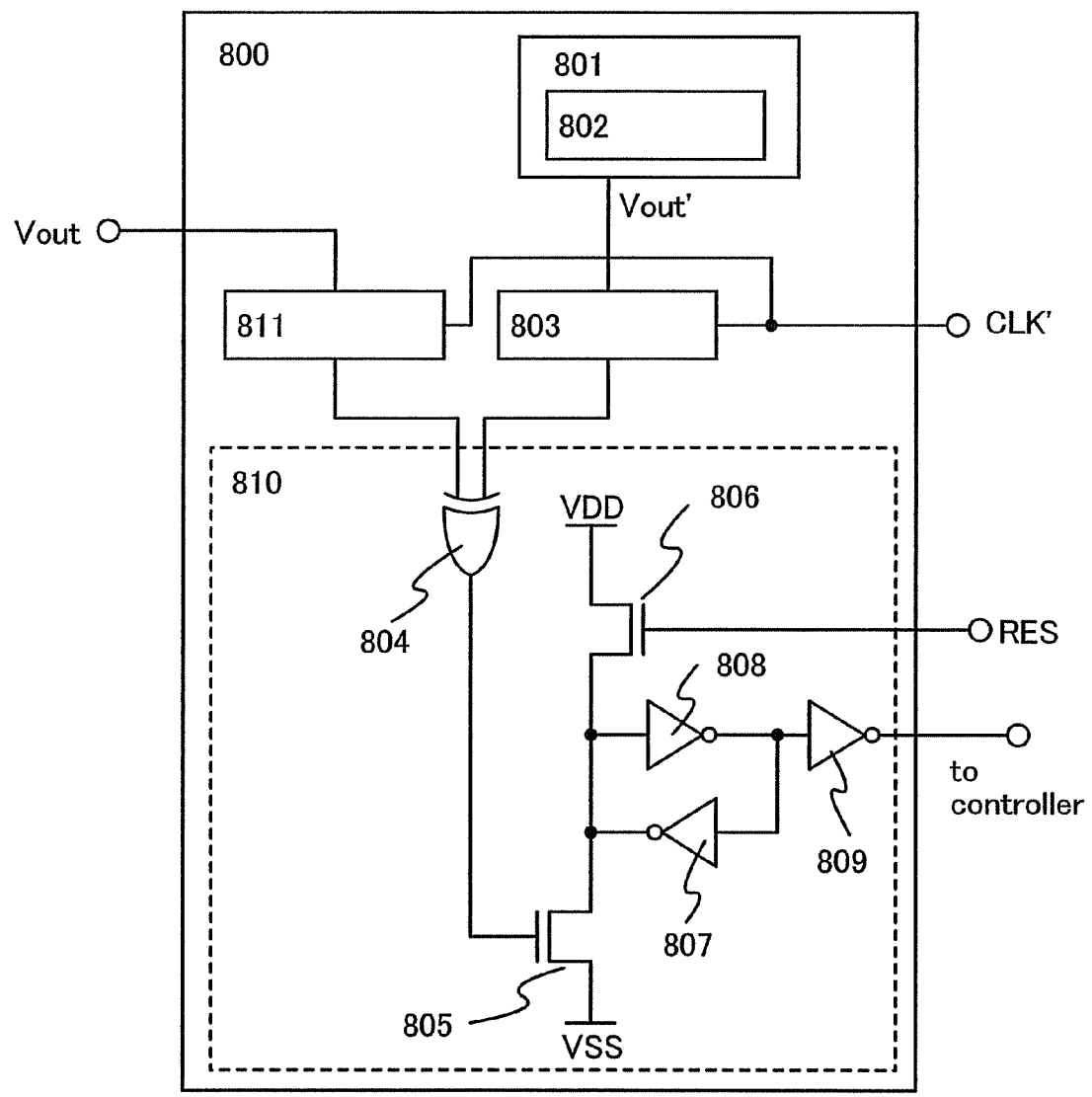
FIG. 4 illustrates a structure of a decision circuit.

FIG. 4 shows an example of a specific structure of a decision circuit. A decision circuit 800 shown in FIG. 4 is provided with a shift register 801 which includes an output circuit 802 and is provided separately from a scan line driver circuit. The decision circuit 800 includes a storage circuit 811, a storage circuit 803, and a comparison circuit 810.

Voltage Vout output from an output circuit of the scan line driver circuit is held in the storage circuit 811. Voltage Vout' output from the output circuit 802 is held in the storage circuit 803. The voltage Vout' is set to a value optimal for operating a pixel portion. By comparison of the voltage Vout' and the Vout which is actually output from the output circuit, whether the voltage Vout satisfies a predetermined value is decided in the comparison circuit 810.

Pieces of data are output from the storage circuits 811 and 803 to the comparison circuit 810 in accordance with a clock signal CLK' shifted by a quarter of a period with respect to the clock signal CLK. In FIG. 4, the comparison circuit 810 includes an exclusive OR (ExOR) gate 804, a switching element 805, a switching element 806, an inverter 807, an inverter 808, and an inverter 809.

The pieces of data output from the storage circuits 811 and 803 are input to the ExOR gate 804. When the two pieces of data correspond to each other, the ExOR gate 804 outputs low-level voltage. When the two pieces of data do not correspond to each other, the ExOR gate 804 outputs high-level voltage. The switching element 805 is turned off when the low-level voltage is output from the ExOR gate 804 and is turned on when the high-level voltage is output from the ExOR gate 804.

Switching of the switching element 806 is controlled by a reset signal RES. When the switching element 806 is turned on, the high-level voltage VDD is applied to and held in the inverters 807 and 808 forming a flip-flop. When the two pieces of data correspond to each other and the switching element 805 is turned off, the voltage VDD is held by the inverters 807 and 808. On the other hand, when the two pieces of data do not correspond to each other and the switching element 805 is turned on, the low-level voltage VSS is applied through the switching element 805 to the inverters 807 and 808 forming the flip-flop and held in the inverters 807 and 808.

The voltage held in the inverters 807 and 808 is inverted by the inverter 809 and output as a signal to a controller. In the controller, whether the voltage Vout output from the output circuit satisfies a predetermined value is decided in accordance with the level of voltage of a signal input from the decision circuit 800, and the voltage VCC can be set to an optimal value.

This embodiment mode can be implemented in combination with the aforementioned embodiment modes.

Embodiment Mode 5

In this embodiment mode, a detailed structure and an operation of a scan line driver circuit included in a semiconductor device of the invention are described.

Figure 5A:
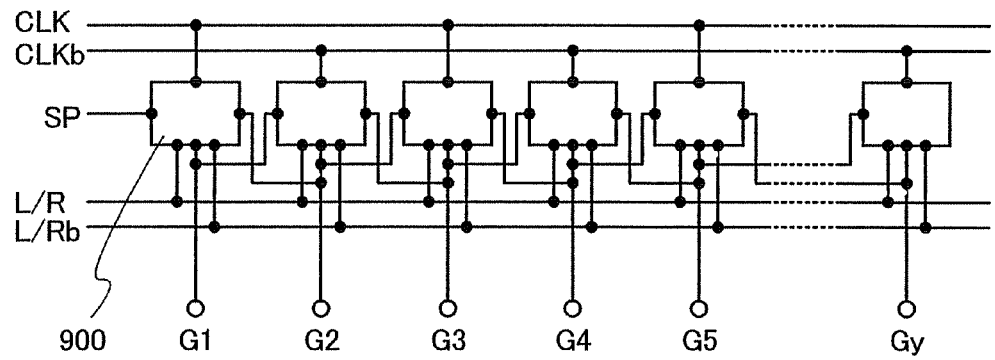
FIGS. 5A to 5C each illustrate a structure of a scan line driver circuit.

FIG. 5A shows a structure of a scan line driver circuit in this embodiment mode. The scan line driver circuit shown in FIG. 5A includes a plurality of pulse output circuits 900. A clock signal CLK, a clock signal CLKb shifted by a half of a period with respect to the clock signal CLK, a start pulse signal SP, a scan direction switching signal L/R, and a scan direction switching signal L/Rb which is obtained by inverting voltage of the scan direction switching signal L/R are input to each of the pulse output circuits 900. The plurality of pulse output circuits 900 sequentially output pulses to scan lines G1 to Gy corresponding thereto in accordance with input of the aforementioned signals.

Figure 5B:
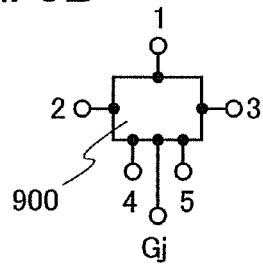
Figure 5C:
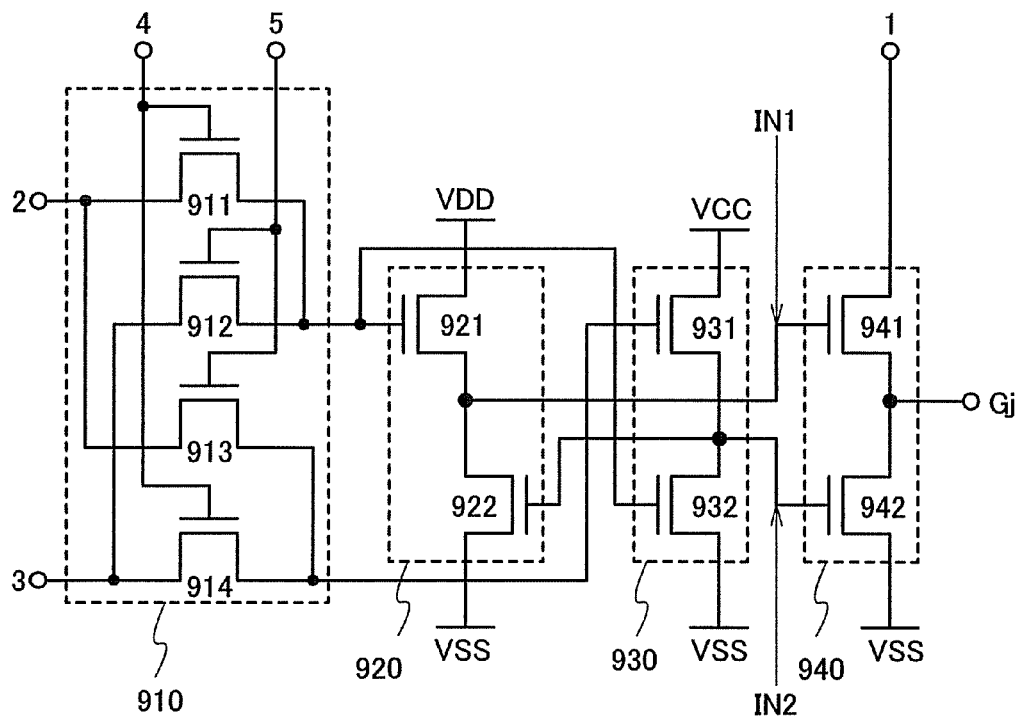

FIG. 5C shows an example of a specific circuit diagram of the pulse output circuit 900. Note that in order to clarify input and output of the signals of the pulse output circuit shown in FIG. 5C, FIG. 5B shows the pulse output circuit 900 shown in FIG. 5A in which terminals are numbered from 1 to 5. The terminals 1 to 5 of the pulse output circuit 900 shown in FIG. 5B correspond to the terminals 1 to 5 of the pulse output circuit shown in FIG. 5C.

The pulse output circuit shown in FIG. 5C includes a scan direction switching circuit 910, a first amplitude compensation circuit 920, a second amplitude compensation circuit 930, and an output circuit 940. The scan direction switching circuit 910 can switch the order of selection of the scan lines in accordance with the scan direction switching signals L/R and L/Rb. The first amplitude compensation circuit 920 and the second amplitude compensation circuit 930 control switching of the output circuit 940 in accordance with a pulse output from the pulse output circuit in the next stage and one of the start pulse signal SP and a pulse output from the pulse output circuit in the previous stage. The output circuit 940 samples and outputs a pulse of the clock signal CLK or the clock signal CLKb to the pulse output circuit in the previous stage or the scan line Gj (j=1 to y).

Specifically, the scan direction switching circuit 910 includes transistors 911 to 914. The first amplitude compensation circuit 920 includes transistors 921 and 922. The second amplitude compensation circuit 930 includes transistors 931 and 932. The output circuit 940 includes transistors 941 and 942.

A gate of the transistor 911 is connected to the terminal 4. One of a source and a drain of the transistor 911 is connected to the terminal 2. The other of the source and the drain of the transistor 911 is connected to a gate of the transistor 921 and a gate of the transistor 932. A gate of the transistor 912 is connected to the terminal 5. One of a source and a drain of the transistor 912 is connected to the terminal 3. The other of the source and the drain of the transistor 912 is connected to the gate of the transistor 921 and the gate of the transistor 932. A gate of the transistor 913 is connected to the terminal 5. One of a source and a drain of the transistor 913 is connected to the terminal 2. The other of the source and the drain of the transistor 913 is connected to a gate of the transistor 931. A gate of the transistor 914 is connected to the terminal 4. One of a source and a drain of the transistor 914 is connected to the terminal 3. The other of the source and the drain of the transistor 914 is connected to the gate of the transistor 931.

The voltage VDD is applied to one of a source and a drain of the transistor 921. The other of the source and the drain of the transistor 921 is connected to a gate of the transistor 941. A gate of the transistor 922 is connected to a gate of the transistor 942. One of a source and a drain of the transistor 922 is connected to the gate of the transistor 941. The voltage VSS is applied to the other of the source and the drain of the transistor 922.

The voltage VCC is applied to one of a source and a drain of the transistor 931. The other of the source and the drain of the transistor 931 is connected to the gate of the transistor 922 and the gate of the transistor 942. One of a source and a drain of the transistor 932 is connected to the gate of the transistor 922 and the gate of the transistor 942. The voltage VSS is applied to the other of the source and the drain of the transistor 932.

One of a source and a drain of the transistor 941 is connected to the terminal 1. The other of the source and the drain of the transistor 941 is connected to the scan line Gj. One of a source and a drain of the transistor 942 is connected to the scan line Gj. The voltage VSS is applied to the other of the source and the drain of the transistor 942.

Figure 6:
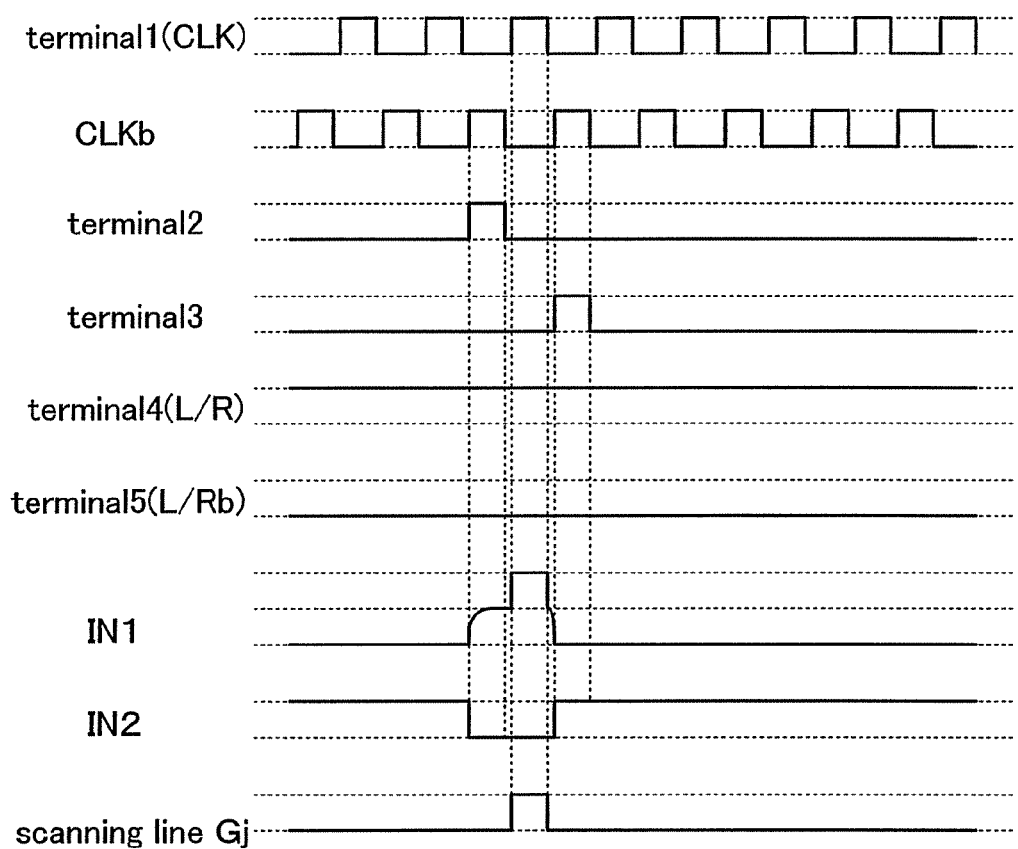
FIG. 6 is a timing chart of a pulse output circuit.

FIG. 6 shows timing of voltages of the terminals 1 to 5 in the pulse output circuit 900 and the scan line Gj shown in FIG. 5C. FIG. 6 also shows timing of voltage IN1 input to the gate of the transistor 941 and voltage IN2 input to the gate of the transistor 942.

FIG. 6 first shows the case in which voltage of the scan direction switching signal L/R input to the terminal 4 is at high level and voltage of the scan direction switching signal L/Rb input to the terminal 5 is at low level. Accordingly, the transistors 911 and 914 are on, and the transistors 912 and 913 are off. Even when the voltage of the scan direction switching signal L/R is at low level and the voltage of the scan direction switching signal L/Rb is at high level, a basic operation is the same, except that a scan direction is switched.

As shown in FIG. 6, low-level voltage is input to the terminals 2 and 3 before a pulse of the start pulse signal SP is input to the terminal 2. Accordingly, all the transistors 921, 922, 931, and 932 are off. Voltage applied in the previous cycle is held in the gates of the transistors 941 and 942.

Next, when the pulse of the start pulse signal SP is input to the terminal 2, high-level voltage is applied to the gates of the transistors 921 and 932; thus, the transistors 921 and 932 are turned on. Accordingly, the voltage VDD is applied as the voltage IN1 to the gate of the transistor 941 through the transistor 921, so that the transistor 941 is turned on. Further, the voltage VSS is applied as the voltage IN2 to the gate of the transistor 942 through the transistor 932, so that the transistor 942 is turned off. At this time, since the voltage of the clock signal CLK input to the terminal 1 is low, low-level voltage is output to the scan line Gj.

Moreover, since the voltage input to the terminal 3 remains at low level, the transistor 931 remains off. The voltage VSS is applied to the gate of the transistor 922 through the transistor 932, so that the transistor 922 is turned off.

Next, when low-level voltage is input to the terminal 2 again, low-level voltage is applied to the gates of the transistors 921 and 932; thus, the transistors 921 and 932 are turned off. Further, the voltage input to the terminal 3 remains at low level, so that the transistor 931 remains off. Accordingly, the gates of the transistors 922 and 942 are set to be in a floating state, and the voltage IN2 remains at low level; thus, the transistors 922 and 924 are turned off.

At this time, the gate of the transistor 941 is also set to be in a floating state, and the voltage of the clock signal CLK input to the terminal 1 becomes high level; thus, the voltage IN1 of the gate of the transistor is further raised by bootstrap. Accordingly, the transistor 941 remains on; thus, the high-level voltage of the clock signal CLK is sampled and output to the scan line Gj.

Next, the voltage input to the terminal 2 remains at low level, so that the transistors 921 and 932 remain off. On the other hand, the voltage input to the terminal 3 becomes high level, so that the transistor 931 is turned on. Then, the voltage VCC is applied to the gate of the transistor 922 through the transistor 931, and the transistors 922 and 942 are turned on. Accordingly, the voltage VSS is applied as the voltage IN1 to the gate of the transistor 941 through the transistor 922, and the transistor 941 is turned off. Further, the voltage VCC is applied as the voltage IN2 to the gate of the transistor 942 through the transistor 931. Accordingly, the transistor 942 is turned on, and the voltage VSS is applied to the scan line Gj through the transistor 942.

Note that this embodiment mode describes the structure in which the pulse output circuit 900 includes the scan direction switching circuit 910; however, the invention is not limited to this structure. When the order of selection of the scan lines does not need to be switched, the scan direction switching circuit 910 is not necessarily provided.

This embodiment mode can be implemented in combination with the aforementioned embodiment modes.

Embodiment Mode 6

Figure 7:
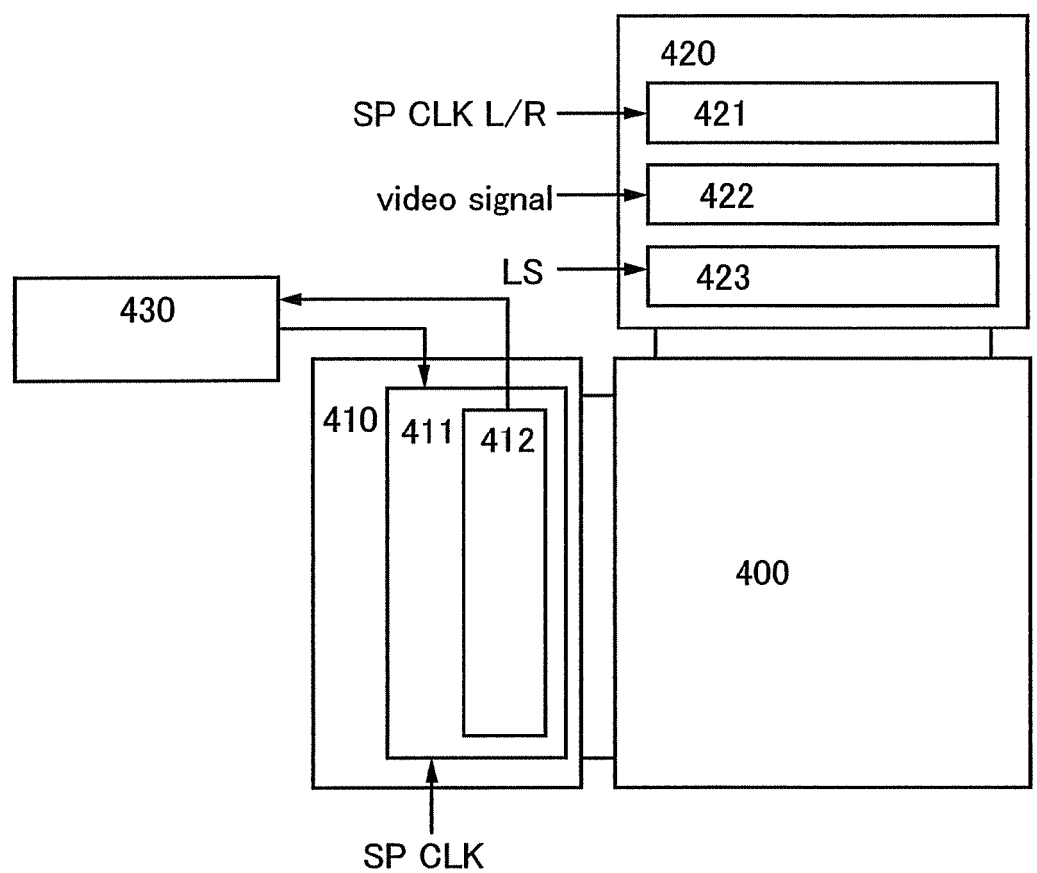
FIG. 7 is a block diagram showing a structure of a display device of the invention.

In this embodiment mode, a general structure of a display device of the invention, which includes a voltage generation circuit and a scan line driver circuit, is described. FIG. 7 is a block diagram of a display device in this embodiment mode. The display device shown in FIG. 7 includes a pixel portion 400 which includes a plurality of pixels each provided with a display element, a scan line driver circuit 410 which selects the pixels per line, a signal line driver circuit 420 which controls input of video signals to the pixels in a selected line, and a voltage generation circuit 430.

In FIG. 7, the signal line driver circuit 420 includes a shift register 421, a first latch 422, and a second latch 423. A clock signal CLK, a start pulse signal SP, and a scan direction switching signal L/R are input to the shift register 421. The shift register 421 generates a timing signal whose pulses are sequentially shifted, in accordance with the clock signal CLK and the start pulse signal SP and outputs the timing signal to the first latch 422. The order of appearance of the pulses of the timing signal is switched by the scan direction switching signal L/R.

When the timing signal is input to the first latch 422, video signals are sequentially written to the first latch 422 in accordance with the pulses of the timing signal and held therein. Note that in this embodiment mode, video signals are sequentially written to a plurality of storage circuits included in the first latch 422; however, the invention is not limited to this structure. So-called division driving may be performed in which a plurality of storage circuits included in the first latch 422 are divided into several groups and video signals are input to respective groups at the same time. Note that the number of groups at this time is referred to as the division number. For example, when the latch is divided into groups of four storage circuits, division driving is performed with a division number of four.

Time it takes to complete writing of video signals to all of the storage circuits in the first latch 422 is referred to as a line period. In practice, a period in which a horizontal retrace interval is added to the line period may be referred to as a line period.

When one line period ends, the video signals held in the first latch 422 are written to the second latch 423 all at once and held therein in accordance with a pulse of a latch signal LS input to the second latch 423. The next video signals are sequentially written to the first latch 422 which has finished transmitting the video signals to the second latch 423, in accordance with the timing signal from the shift register 421 again. In the next one line period, the video signals written to and held in the second latch 423 are input to the pixel portion 400.

Note that in the signal line driver circuit 420, a circuit that can output a signal whose pulses are sequentially shifted may be used instead of the shift register 421.

Note that in FIG. 7, the pixel portion 400 is directly connected subsequent to the second latch 423; however, the invention is not limited to this structure. A circuit that processes the video signal output from the second latch 423 can be provided in front of the pixel portion 400. Examples of circuits that perform signal processing include a buffer which can shape a waveform, a level shifter which can amplify amplitude, and a digital-analog converter circuit which can convert a digital signal into an analog signal.

Next, a structure of the scan line driver circuit 410 is described. The scan line driver circuit 410 includes a shift register 411. The shift register 411 includes an output circuit 412. In the scan line driver circuit 410, the clock signal CLK, the start pulse signal SP, and the scan direction switching signal L/R are input to the shift register 411; thus, a selection signal whose pulses are sequentially shifted is output from the output circuit 412. The order of appearance of the pulses of the selection signal is switched by the scan direction switching signal L/R. By input of the pulse of the generated selection signal to a scan line, pixels in the scan line are selected, and a video signal is input to the pixel.

Note that in FIG. 7, the pixel portion 400 is directly connected subsequent to the shift register 411; however, the invention is not limited to this structure. A circuit that processes the selection signal output from the shift register 411 may be provided in front of the pixel portion 400. Examples of circuits that perform signal processing include a buffer which can shape a waveform and a level shifter which can amplify amplitude.

In the case of an active matrix display device, gates of transistors included in pixels of one line are connected to a scan line. Accordingly, when the pixel portion 400 is directly connected subsequent to the shift register 411, it is preferable for the output circuit 412 to use a transistor having current supply capacity high enough to turn on transistors in pixels of one line all at once.

The pixel portion 400, the scan line driver circuit 410, the signal line driver circuit 420, and the voltage generation circuit 430 can be formed over the same substrate. Alternatively, any of them may be formed using a different substrate.

Figure 8A:
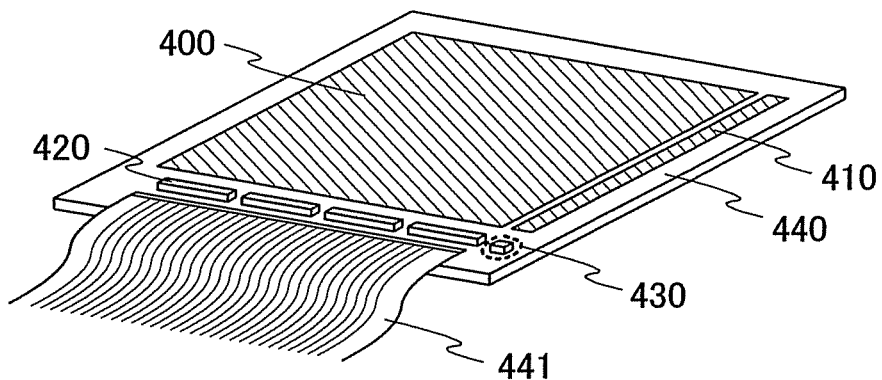
FIGS. 8A to 8C each illustrate an external appearance of a display device of the invention.

FIG. 8A shows one mode of a display device in which the signal line driver circuit 420 which is formed separately is mounted on a substrate 440 provided with the pixel portion 400 and the scan line driver circuit 410. In practice, another substrate is provided so that the pixel portion 400 is interposed between the substrate 440 and the substrate. In order to clarify arrangement of the pixel portion 400, the scan line driver circuit 410, the signal line driver circuit 420, and the voltage generation circuit 430, FIG. 8A shows a mode in which another substrate is omitted on purpose.

The voltage generation circuit 430 is formed separately and is mounted on the substrate 440. Power supply voltage, various signals, and the like are supplied to the pixel portion 400, the signal line driver circuit 420, the scan line driver circuit 410, and the voltage generation circuit 430 through an FPC 441. In FIG. 8A, each of the signal line driver circuit 420 and the voltage generation circuit 430 may include a transistor using a single crystalline semiconductor, a transistor using a polycrystalline semiconductor, or a transistor using an SOI.

Figure 8B:
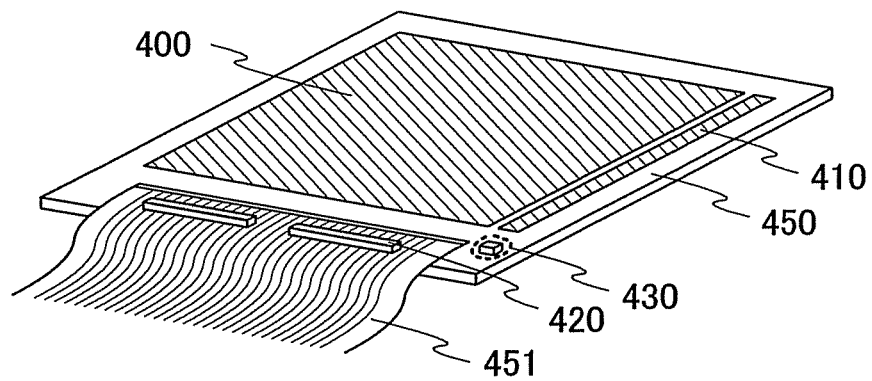

Note that when the signal line driver circuit 420 is mounted, a substrate provided with the signal line driver circuit 420 is not necessarily attached to the substrate provided with the pixel portion 400. For example, it may be attached to an FPC. FIG. 8B shows one mode of a display device in which the signal line driver circuit 420 which is formed separately is attached to an FPC 451 so as to be mounted on a substrate 450 provided with the pixel portion 400 and the scan line driver circuit 410. In practice, another substrate is provided so that the pixel portion 400 is interposed between the substrate 450 and the substrate. In order to clarify arrangement of the pixel portion 400, the scan line driver circuit 410, the signal line driver circuit 420, and the voltage generation circuit 430, FIG. 8B shows a mode in which another substrate is omitted on purpose. The voltage generation circuit 430 is formed separately and is mounted on the substrate 450. Power supply voltage, various signals, and the like are supplied to the pixel portion 400, the signal line driver circuit 420, the scan line driver circuit 410, and the voltage generation circuit 430 through an FPC 451. In FIG. 8B, each of the signal line driver circuit 420 and the voltage generation circuit 430 may include a transistor using a single crystalline semiconductor, a transistor using a polycrystalline semiconductor, or a transistor using an SOI.

Figure 8C:
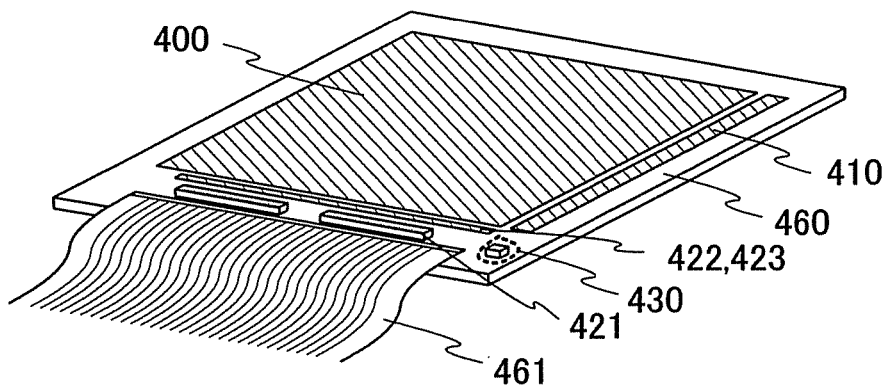

Alternatively, a part of the signal line driver circuit 420 may be formed over the same substrate as the pixel portion 400 and the scan line driver circuit 410, and the other part of the signal line driver circuit 420 may be separately formed and mounted on the substrate. FIG. 8C shows one mode of a display device in which the shift register 421 of the signal line driver circuit 420, which is formed separately, is mounted on a substrate 460 provided with the first latch 422 and the second latch 423 included in the signal line driver circuit 420 as well as the pixel portion 400 and the scan line driver circuit 410. In practice, another substrate is provided so that the pixel portion 400 is interposed between the substrate 460 and the substrate. In order to clarify arrangement of the pixel portion 400, the scan line driver circuit 410, the first latch 422, the second latch 423, the shift register 421, and the voltage generation circuit 430, FIG. 8C shows a mode in which another substrate is omitted on purpose. The voltage generation circuit 430 is formed separately and is mounted on the substrate 460. Power supply voltage, various signals, and the like are supplied to the pixel portion 400, the first latch 422, the second latch 423, the shift register 421, the scan line driver circuit 410, and the voltage generation circuit 430 through an FPC 461. In FIG. 8C, each of the shift register 421 and the voltage generation circuit 430 may include a transistor using a single crystalline semiconductor, a transistor using a polycrystalline semiconductor, or a transistor using an SOI.

Note that there are no particular limitations on a connection method of a substrate which is formed separately, and a known COG method, wire bonding method, or TAB method, or the like can be used. In addition, a position of connection is not limited to the positions shown in FIGS. 8A to 8C as long as electrical connection is possible. Further, a controller, a CPU, a memory, or the like may be formed separately and connected.

An integrated circuit such as a driver circuit is formed separately and is mounted on a substrate; thus, yield can be improved and optimization of a process depending on characteristics of each circuit can be easily performed as compared with the case where all circuits are formed over the same substrate as a pixel portion.

Note that the display device of the invention includes active matrix display devices, for example, a liquid crystal display device, a light-emitting device in which each pixel is provided with a light-emitting element typified by an organic light-emitting diode (OLED), a digital micromirror device (DMD), a plasma display panel (PDP), and a field emission display (FED) in its category. In addition, the display device of the invention also includes passive matrix display devices in its category.

This embodiment mode can be implemented in combination with the aforementioned embodiment modes.

Embodiment 1

In this embodiment, a more specific structure of a signal line driver circuit included in the display device of the invention is described.

Figure 9:
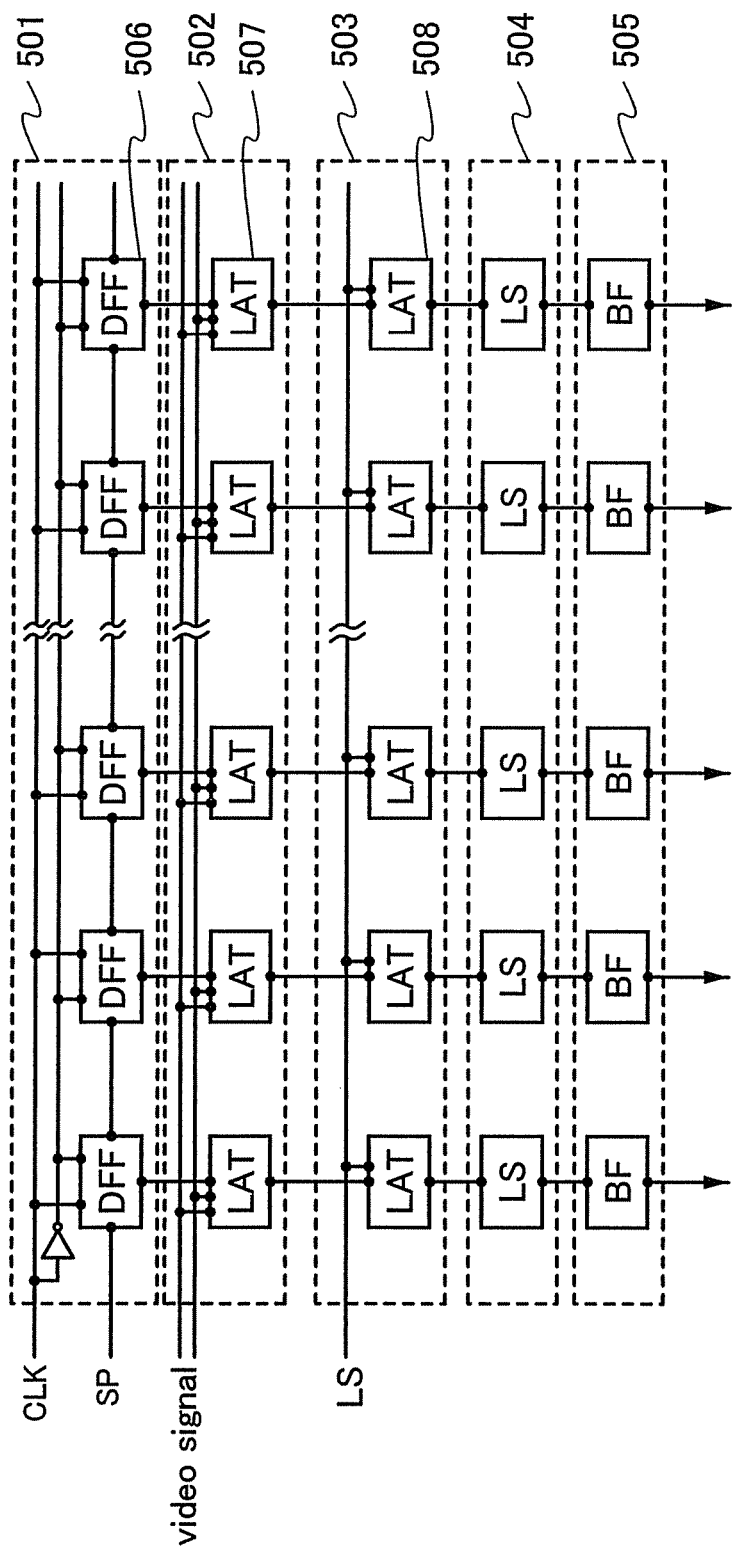
FIG. 9 is a block diagram showing a structure of a signal line driver circuit.

FIG. 9 shows an example of a circuit diagram of a signal line driver circuit. The signal line driver circuit shown in FIG. 9 includes a shift register 501, a first latch 502, a second latch 503, a level shifter 504, and a buffer 505.

The shift register 501 includes a plurality of delay flip-flops (DFFs) 506. The shift register 501 generates a timing signal whose pulses are sequentially shifted, in accordance with the start pulse signal SP and the clock signal CLK input thereto, and outputs the timing signal to the first latch 502 in the next stage.

The first latch 502 includes a plurality of storage circuits (LATs) 507. The first latch 502 sequentially samples video signals in accordance with the pulses of the timing signal input thereto and writes data of the sampled video signal to the storage circuits 507.

The second latch 503 includes a plurality of storage circuits (LATs) 508. The number of storage circuits 508 is preferably equal to or more than the number of pixels of one line in a pixel portion.

The data of the video signals which are written to the storage circuits 507 by the first latch 502 is written to the storage circuits 508 included in the second latch 503 in accordance with a pulse of a latch signal LS and held therein. Then, the data held in the storage circuits 508 is output as a video signal to the level shifter 504 in the next stage.

The level shifter 504 controls amplitude of voltage of the video signal input thereto and outputs the resulting video signal to the buffer 505 in the next stage. After a waveform of the video signal input to the buffer 505 is shaped by the buffer 505, the resulting video signal is output to a signal line.

This embodiment can be implemented in combination with the aforementioned embodiment modes.

Embodiment 2

In this embodiment, a structure of a pixel portion included in an active matrix light-emitting device, which is a kind of display device of the invention, is described.

In the active matrix light-emitting device, each pixel is provided with a light-emitting element which corresponds to a display element. Since the light-emitting element emits light by itself, it has high visibility and is optimal for reduction in thickness of the device because a backlight required in a liquid crystal display device is not necessary. Further, the light-emitting element has no limitation on viewing angles. In this embodiment, a light-emitting device using an organic light-emitting diode (OLED), which is a kind of light-emitting element, is described; however, the invention also includes a light-emitting device using another light-emitting element.

The OLED includes a layer containing a material in which luminescence (electroluminescence) generated by application of an electric field can be obtained (hereinafter referred to as an electroluminescent layer), an anode layer, and a cathode layer. As electroluminescence, there are luminescence (fluorescence) at the time of returning to a ground state from a singlet-excited state and luminescence (phosphorescence) at the time of returning to a ground state from a triplet-excited state. In a light-emitting device of the invention, one or both of fluorescence and phosphorescence may be used.

Figure 10A:
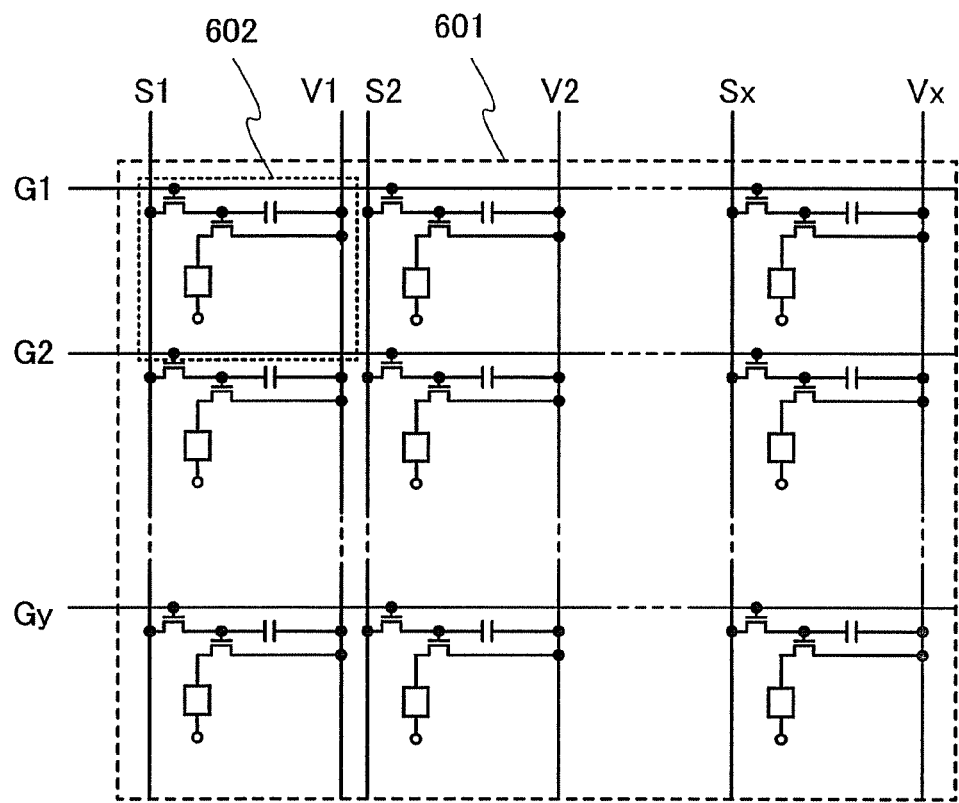
FIGS. 10A and 10B each illustrate a structure of a pixel portion.

FIG. 10A is an enlarged view of a pixel portion 601 of a light-emitting device in this embodiment. The pixel portion 601 includes a plurality of pixels 602 arranged in matrix. Reference signs S1 to Sx denote signal lines; reference signs V1 to Vx denote power supply lines; and reference signs G1 to Gy denote scan lines. In this embodiment, the pixel 602 includes one of the signal lines S1 to Sx, one of the power supply lines V1 to Vx, and one of the scan lines G1 to Gy.

Figure 10B:
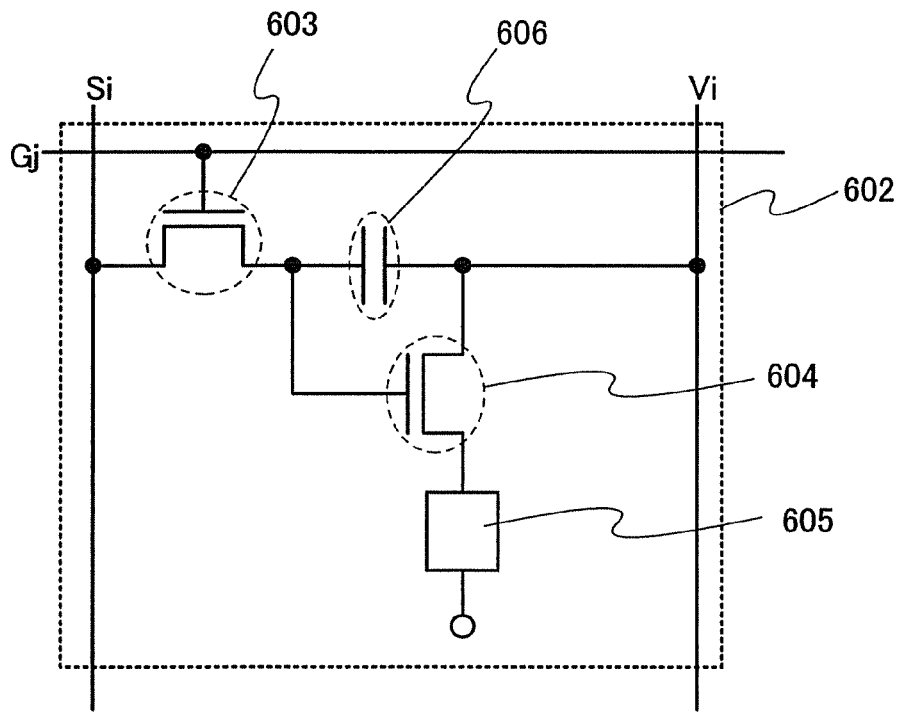

FIG. 10B is an enlarged view of the pixel 602. In FIG. 10B, reference numeral 603 denotes a switching transistor. A gate of the switching transistor 603 is connected to the scan line Gj (j=1 to y). One of a source and a drain of the switching transistor 603 is connected to the signal line Si (i=1 to x). The other of the source and the drain of the switching transistor 603 is connected to a gate of a driving transistor 604. A storage capacitor 606 is provided between the power supply line Vi (i=1 to x) and the gate of the driving transistor 604.

The storage capacitor 606 is provided to hold gate voltage (voltage between the gate and a source) of the driving transistor 604 when the switching transistor 603 is off. Note that the structure in which the storage capacitor 606 is provided is described in this embodiment; however, the invention is not limited to this structure, and the storage capacitor 606 is not necessarily provided.

One of the source and a drain of the driving transistor 604 is connected to the power supply line Vi (i=1 to x). The other of the source and the drain of the driving transistor 604 is connected to a light-emitting element 605. The light-emitting element 605 includes an anode, a cathode, and an electroluminescent layer provided between the anode and the cathode. When the anode is connected to the source or the drain of the driving transistor 604, the anode corresponds to a pixel electrode and the cathode corresponds to a counter electrode. On the other hand, when the cathode is connected to the source or the drain of the driving transistor 604, the cathode corresponds to the pixel electrode and the anode corresponds to the counter electrode.

Predetermined voltages are applied to the counter electrode of the light-emitting element 605 and the power supply line Vi, respectively.

When the scan line Gj is selected in accordance with pulses of selection signals input to the scan lines G1 to Gy from a scan line driver circuit, that is, when the pixels 602 of a line corresponding to the scan line Gj are selected, the switching transistor 603, the gate of which is connected to the scan line Gj, in each of the pixels 602 of the line is turned on. Then, when a video signal is input to the signal line Si, the gate voltage of the driving transistor 604 is determined in accordance with voltage of the video signal. When the driving transistor 604 is turned on, the power supply line Vi and the light-emitting element 605 are electrically connected, so that the light-emitting element 605 emits light by supply of current. On the other hand, when the driving transistor 604 is turned off, the power supply line Vi and the light-emitting element 605 are not electrically connected, so that current is not supplied to the light-emitting element 605 and the light-emitting element 605 does not emit light.

Each of the switching transistor 603 and the driving transistor 604 can be either an n-channel transistor or a p-channel transistor. Note that when the source or the drain of the driving transistor 604 is connected to the anode of the light-emitting element 605, the driving transistor 604 is preferably a p-channel transistor. Alternatively, when the source or the drain of the driving transistor 604 is connected to the cathode of the light-emitting element 605, the driving transistor 604 is preferably an n-channel transistor.

In addition, each of the switching transistor 603 and the driving transistor 604 may have a multi-gate structure such as a double-gate structure or a triple-gate structure, instead of a single-gate structure.

Note that the invention can be applied to not only a display device including pixels having the circuit structures shown in FIGS. 10A and 10B but also a display device including pixels having various circuit structures. The pixel included in the display device of the invention may have a threshold voltage compensation circuit structure in which the threshold voltage of a driving transistor can be compensated, or a current input circuit structure in which the threshold voltage and mobility of a driving transistor can be compensated by input of current, for example.

This embodiment can be implemented in combination with the aforementioned embodiment modes and embodiment.

Embodiment 3

In this embodiment, a structure of a pixel portion included in an active matrix liquid crystal display device, which is a kind of display device of the invention, is described.

Figure 11:
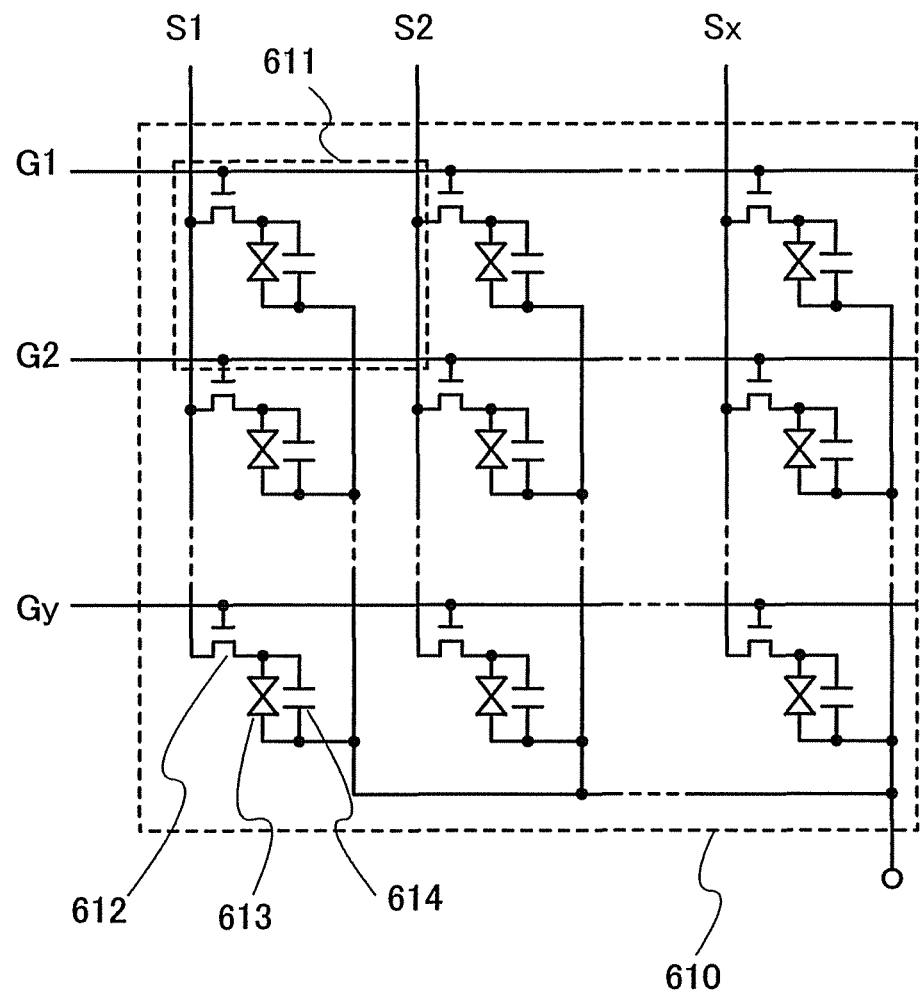
FIG. 11 illustrates a structure of a pixel portion.

FIG. 11 is an enlarged view of a pixel portion 610 of a display device in this embodiment. In FIG. 11, the pixel portion 610 includes a plurality of pixels 611 arranged in matrix. Reference signs S1 to Sx denote signal lines, and reference signs G1 to Gy denote scan lines. In this embodiment, each of the pixels 611 includes one of the signal lines S1 to Sx and one of the scan lines G1 to Gy.

The pixel 611 includes a transistor 612 functioning as a switching element, a liquid crystal cell 613 corresponding to a display element, and a storage capacitor 614. The liquid crystal cell 613 includes a pixel electrode, a counter electrode, and liquid crystals to which voltage is applied using the pixel electrode and the counter electrode. A gate of the transistor 612 is connected to the scan line Gj (j=1 to y). One of a source and a drain of the transistor 612 is connected to the signal line Si (i=1 to x). The other of the source and the drain of the transistor 612 is connected to the pixel electrode of the liquid crystal cell 613. One of two electrodes of the storage capacitor 614 is connected to the pixel electrode of the liquid crystal cell 613. The other of the two electrodes of the storage capacitor 614 is connected to a common electrode. The common electrode may be connected to either the counter electrode of the liquid crystal cell 613 or another scan line.

When the scan line Gj is selected, that is, when the pixels 611 of a line corresponding to the scan line Gj are selected, in accordance with pulses of selection signals input to the scan lines G1 to Gy from a scan line driver circuit, each transistor 612, the gate of which is connected to the scan line Gj, in the pixels 611 of the line is turned on. Then, when a video signal is input to the signal line Si from a signal line driver circuit, voltage is applied between the pixel electrode and the counter electrode of the liquid crystal cell 613 in accordance with voltage of the video signal. Transmittance of the liquid crystal cell 613 is determined in accordance with a value of the voltage applied between the pixel electrode and the counter electrode. Further, the voltage between the pixel electrode and the counter electrode of the liquid crystal cell 613 is held in the storage capacitor 614.

This embodiment can be implemented in combination with the aforementioned embodiment modes and embodiments.

Embodiment 4

Next, a specific method of manufacturing a display device of the invention is described. Note that in this embodiment, a light-emitting device including a transistor is described as an example.

First, a conductive film is formed over a substrate 700, and thereafter, conductive films 701 and 702 are formed by processing (patterning) the conductive film into predetermined shapes. The substrate 700 can be a glass substrate using barium borosilicate glass, aluminoborosilicate glass, or the like, a quartz substrate, a ceramic substrate, or the like. Alternatively, a metal substrate such as a stainless steel substrate or a semiconductor substrate such as a silicon substrate may be used. Note that when a substrate with high conductivity is used, the conductive films 701 and 702 should be formed after an insulating film is formed over the substrate. Although a substrate formed of a synthetic resin having flexibility, such as plastic, generally tends to have lower heat-resistant temperature than the aforementioned substrate, the substrate can be used as long as it can resist a processing temperature in a manufacturing process.

For a plastic substrate, polyester typified by polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), polyimide, an acrylonitrile butadiene styrene resin, polyvinyl chloride, polypropylene, polyvinyl acetate, an acrylic resin, or the like can be used.

For the conductive films 701 and 702, tantalum (Ta), tungsten (W), titanium (Ti), molybdenum (Mo), aluminum (Al), copper (Cu), chromium (Cr), niobium (Nb), and the like can be used. Further, an alloy material containing the aforementioned metal as its main component, or a compound material containing the aforementioned metal may be used. Alternatively, the conductive films 701 and 702 may be formed using a semiconductor, for example, polycrystalline silicon doped with an impurity element, such as phosphorus, which imparts conductivity to a semiconductor film.

In this embodiment, each of the conductive films 701 and 702 is formed of a single-layer conductive film; however, this embodiment is not limited to this structure. Each of the conductive films 701 and 702 may be formed by stacking two or more conductive films. In the case of a three-layer structure in which three conductive films are stacked, a stacked-layer structure of a molybdenum film, an aluminum film, and a molybdenum film is preferably employed. The conductive film can be formed by a CVD method, a sputtering method, or the like.

Next, a gate insulating film 703 is formed so as to cover the conductive films 701 and 702. The gate insulating film 703 can be formed to have a single-layer structure or a stacked-layer structure of a film containing silicon oxide, silicon nitride (e.g., $SiN_x$ or $Si_3N_4$), silicon oxynitride ($SiO_xN_y$) (x>y>0), silicon nitride oxide ($SiN_xO_y$) (x>y>0), or the like by a plasma CVD method, a sputtering method, or the like. When a stacked-layer structure is employed, it is preferable to employ a three-layer structure of a silicon oxide film, a silicon nitride film, and a silicon oxide film from the side of the conductive films 701 and 702, for example.

Next, a first semiconductor film 704 is formed over the gate insulating film 703. The thickness of the first semiconductor film 704 is in the range of 20 to 200 nm (preferably 40 to 170 nm, and more preferably 50 to 150 nm). Note that the first semiconductor film 704 may be an amorphous semiconductor or a polycrystalline semiconductor. Further, for the semiconductor, silicon germanium can be used as well as silicon. When silicon germanium is used, the concentration of germanium is preferably approximately 0.01 to 4.5 atomic percent.

Note that the first semiconductor film 704 may be crystallized by a known technique. Examples of known crystallization methods include a laser crystallization method using laser light and a crystallization method using a catalytic element. Alternatively, a combination of a crystallization method using a catalytic element and a laser crystallization method can be used. When a substrate that is superior in heat resistance, such as a quartz substrate, is used as the substrate 700, a crystallization method in which at least two or more of a thermal crystallization method using an electric furnace, a lump anneal crystallization method using infrared light, a crystallization method using a catalytic element, and a crystallization method of high-temperature annealing at approximately 950° C. are combined may be used.

For example, when a laser crystallization method is used, heat treatment at 550° C. for 4 hours is performed on the first semiconductor film 704 before laser crystallization in order to improve resistance of the first semiconductor film 704 to laser. Then, by irradiating the first semiconductor film 704 with laser light of second to fourth harmonics of the fundamental wave of a solid state laser capable of continuous oscillation, crystals with a large grain size can be obtained. Typically, a second harmonic (532 nm) or a third harmonic (355 nm) of an $Nd:YVO_4$ laser (a fundamental wave of 1064 nm) is preferably used, for example. Specifically, laser light emitted from a continuous-wave $YVO_4$ laser is converted into a harmonic by using a non-linear optical element, so that laser light with an output of 10 W is obtained. Then, the laser light is preferably shaped into a rectangular shape or an elliptical shape on an irradiation surface by an optical system for irradiation of the first semiconductor film 704. The power density at this time needs to be approximately 0.01 to 100 $MW/cm^2$ (preferably 0.1 to 10 $MW/cm^2$). The scan rate is set at approximately 10 to 2000 cm/sec.

As a continuous-wave gas laser, an Ar laser, a Kr laser, or the like can be used. Further, as a continuous-wave solid state laser, a YAG laser, a $YVO_4$ laser, a YLF laser, a $YAlO_3$ laser, a forsterite ($Mg_2SiO_4$) laser, a $GdVO_4$ laser, a $Y_2O_3$ laser, a glass laser, a ruby laser, an alexandrite laser, a Ti:sapphire laser, or the like can be used.

As a pulsed laser, an Ar laser, a Kr laser, an excimer laser, a $CO_2$ laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper-vapor laser, or a gold-vapor laser can be used, for example.

The laser crystallization may be performed by pulsed laser light at a repetition rate of 10 MHz or more, which is a considerably higher frequency band than a generally used frequency band of several tens to several hundreds of hertz. It is said that it takes several tens to several hundreds of nanoseconds for the first semiconductor film 704 to be completely solidified after being irradiated with pulsed laser light. Therefore, by using the aforementioned frequency, the first semiconductor film 704 can be irradiated with laser light of the next pulse before the semiconductor film is solidified after being melted by the laser light. Accordingly, a solid-liquid interface can be continuously moved in the first semiconductor film 704; thus, the first semiconductor film 704 having crystal grains which have grown continuously in a scanning direction is formed. Specifically, an aggregate of crystal grains each of which have a width of 10 to 30 μm in the scanning direction and a width of approximately 1 to 5 μm in the direction perpendicular to the scanning direction can be formed. By forming single crystal grains which have grown continuously along the scanning direction, the first semiconductor film 704 having few crystal boundaries at least in a channel direction of a transistor can be formed.

Note that laser crystallization may be performed by irradiation with continuous wave laser light of a fundamental wave and continuous wave laser light of a harmonic at the same time or by irradiation with continuous wave laser light of a fundamental wave and pulsed laser light of a harmonic at the same time.

In addition, laser light irradiation may be performed in an inert gas atmosphere of rare gas, nitrogen, or the like. Accordingly, roughness of a semiconductor surface due to laser light irradiation can be suppressed, and variation in threshold value due to variation in interface state density can be suppressed.

By irradiation with the aforementioned laser light, the first semiconductor film 704 with higher crystallinity can be formed. Note that a polycrystalline semiconductor formed by a sputtering method, a plasma CVD method, a thermal CVD method, or the like may be used for the first semiconductor film 704.

Note that the first semiconductor film 704 is crystallized in this embodiment; however, an amorphous silicon film or a microcrystalline semiconductor film may be directly subjected to a step described below without being crystallized. A transistor using an amorphous semiconductor or a microcrystalline semiconductor has advantages of lower cost and higher yield because it needs fewer manufacturing steps than a transistor using a polycrystalline semiconductor.

An amorphous semiconductor can be obtained by glow discharge decomposition of a gas containing silicon. Examples of the gas containing silicon include $SiH_4$ and $Si_2H_6$. The gas containing silicon may be diluted with hydrogen, or hydrogen and helium.

Next, a second semiconductor film 705 and a third semiconductor film 706 are sequentially formed over the first semiconductor film 704. The second semiconductor film 705 is formed without deliberate addition of an impurity for controlling valence electrons. The second semiconductor film 705 has one conductivity type. The second semiconductor film 705 is formed between the first semiconductor film 704 and the third semiconductor film 706 for forming a source region functioning as a source and a drain region functioning as a drain, and thus serves as a buffer layer. Accordingly, when the third semiconductor film 706 having one conductivity type that is the same as the first semiconductor film 704 having low n-type conductivity is formed, the second semiconductor film 705 is not necessarily formed. When a p-type impurity element is added in order to control a threshold value, the second semiconductor film 705 has the effect of changing concentration of the impurity gradually, which is preferable to form a favorable junction. That is, in a transistor to be formed, the second semiconductor film 705 can have a function of a low concentration impurity region (an LDD region) formed between a channel formation region and the source region or the drain region.

When an n-channel transistor is formed, it is preferable that phosphorus which is a typical impurity element be added to the third semiconductor film 706 having one conductivity type and impurity gas such as $PH_3$ be added to gas containing silicon. Each of the second semiconductor film 705 and the third semiconductor film 706 may be an amorphous semiconductor or a polycrystalline semiconductor, similarly to the first semiconductor film 704. Further, for the semiconductor, silicon germanium can be used as sell as silicon.

The gate insulating film 703 to the third semiconductor film 706 having one conductivity type, which have been described above, can be continuously formed without being exposed to the atmosphere. That is, each interface between stacked layers can be formed without being contaminated with components of the atmosphere and a contamination impurity element floating in the atmosphere; thus, variation in characteristics of transistors can be reduced.

Next, as shown in FIG. 12B, a mask 707 is formed, and then, the first semiconductor film 704, the second semiconductor film 705, and the third semiconductor film 706 having one conductivity type are processed (patterned) into desired shapes and separated into island shapes.

Next, as shown in FIG. 12C, a second conductive film 708 is formed after the mask 707 is removed. The second conductive film 708 is formed of aluminum or a conductive material containing aluminum as its main component. Alternatively, a stacked-layer structure may be employed in which a layer on the side in contact with the semiconductor film is formed of titanium, tantalum, molybdenum, tungsten, or copper, or nitride of the aforementioned element. For example, the following combinations can be considered: a first layer is formed of tantalum and a second layer is formed of tungsten; the first layer of tantalum nitride and the second layer of aluminum; the first layer of tantalum nitride and the second layer of copper; and the first layer of titanium, the second layer of aluminum, and a third layer of titanium. Further, an AgPdCu alloy may used for one of the first and second conductive film. Alternatively, a three-layer structure may be employed in which tungsten, an alloy of aluminum and silicon (Al—Si), and titanium nitride are sequentially stacked. Tungsten nitride may be used instead of tungsten, an alloy of aluminum and titanium (Al—Ti) may be used instead of the alloy of aluminum and silicon (Al—Si), and titanium may be used instead of titanium nitride. In order to improve heat resistance of aluminum, 0.5 to 5 atomic percent of an element such as titanium, silicon, scandium, neodymium, or copper may be added.

Figure 13A:
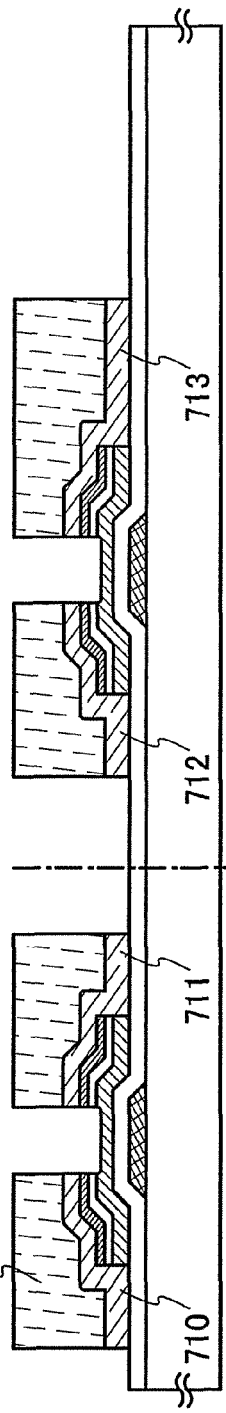
FIGS. 13A to 13C illustrate a manufacturing method of a display device of the invention.

Next, as shown in FIG. 13A, a mask 709 is formed. The mask 709 is for forming a wiring which is connected to the source region or the drain region by pattering the second conductive film 708, and at the same time, is used for an etching mask for forming the channel formation region by removing a part of the third semiconductor film 706 having one conductivity type. The conductive film formed of aluminum or the material containing aluminum as its main component may be etched using chloride gas such as $BCl_3$ or $Cl_2$. By the etching processing, wirings 710 to 713 are formed from the second conductive film 708. Further, etching for forming the channel formation region is performed using fluoride gas such as $SF_6$, $NF_3$, or $CF_4$. In this case, since etching selectivity of the first semiconductor film 704 serving as a base to the semiconductor films 705 and 706 is not sufficient, processing time needs to be adjusted as appropriate. As described above, a structure of a channel-etch transistor can be formed.

Figure 13B:
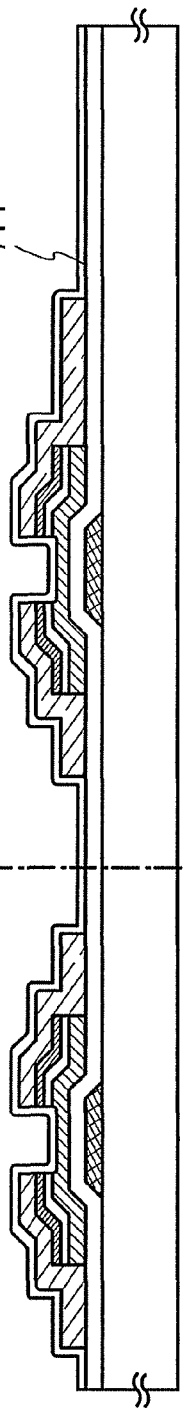

Next, after the mask 709 is removed, an insulating film 714 for protecting the channel formation region is formed of a silicon nitride film as shown in FIG. 13B. The silicon nitride film can be formed by a sputtering method or a glow discharging decomposition method. The silicon nitride film is for preventing intrusion of contamination impurities such as an organic substance, a metal, and moisture floating in the atmosphere, and thus needs to be dense. By RF sputtering with a sputtering gas in which nitrogen is mixed with a rare gas element such as argon with the use of silicon as a target, a denser silicon nitride film can be formed.

Figure 13C:
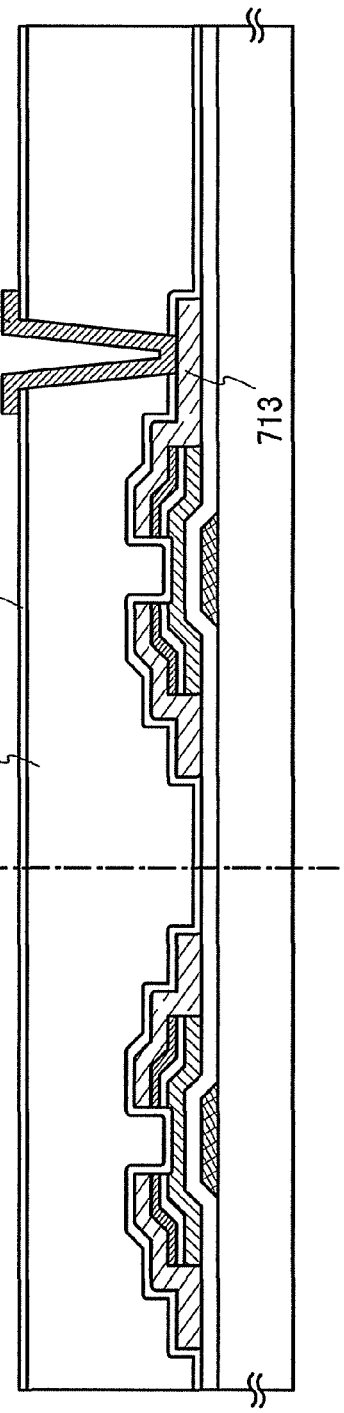

Next, as shown in FIG. 13C, an insulating film 715 for planarization is formed over the insulating film 714. The insulating film 715 is preferably formed of an organic resin such as acrylic, polyimide, or polyamide, or an insulating film containing a siloxane resin. A siloxane resin corresponds to a resin having Si—O—Si bonds formed using a siloxane-based material as a starting material. A siloxane resin may include at least one of hydrogen, fluorine, a fluoro group, and an organic group (e.g., an alkyl group or aromatic hydrocarbon) as a substituent. These materials have water absorption properties. Accordingly, an insulating film 716 for preventing intrusion and extrusion of moisture is preferably formed over the insulating film 715. It is preferable that the above-described silicon nitride film be employed for the insulating film 716.

Next, the insulating films 714, 715, and 716 are patterned, and an opening portion through which part of the wiring 713 is exposed is formed. Then, a wiring 717 which is in contact with the wiring 713 in the opening portion is formed.

Next, as shown in FIG. 14A, an anode 718 is formed over the insulating film 716 so as to be in contact with the wiring 717. In this embodiment, a conductive film is formed of indium tin oxide containing silicon oxide (ITSO) by a sputtering method, and thereafter, the conductive film is patterned; thus, the anode 718 is formed. Note that for the anode 718, a conductive oxide material with a light-transmitting property other than ITSO, for example, indium tin oxide (ITO), zinc oxide (ZnO), indium zinc oxide (IZO), or zinc oxide with gallium added (GZO) may be used.

When ITSO is used, ITO containing 2 to 10 wt % of silicon oxide can be used as a target. Specifically, in this embodiment, the conductive film serving as the anode 718 is formed to a thickness of 105 nm with the use of a target which contains $In_2O_3$, $SnO_2$, and $SiO_2$ at a weight percent ratio of 85:10:5, with conditions of an Ar flow rate of 50 sccm, an $O_2$ flow rate of 3 sccm, a sputtering pressure of 0.4 Pa, a sputtering power of 1 kW, and a deposition rate of 30 nm/min.

After being formed and before being patterned, the conductive film may be polished by a CMP method, by cleansing with a polyvinyl alcohol based porous material, or the like in order that a surface of the conductive film is planarized.

Next, in the invention, before an electroluminescent layer 720 is formed, heat treatment is performed in the atmosphere or heat treatment (vacuum baking) is performed in a vacuum atmosphere in order to remove moisture, oxygen, and the like adsorbed on a partition wall 719 and the anode 718. Specifically, heat treatment is performed in a vacuum atmosphere for approximately 0.5 to 20 hours with a substrate temperature of 200 to 450° C., preferably 250 to 300° C. The heat treatment is performed preferably under a pressure of $4 \times 10^{-5}$ Pa or less, and more preferably, under a pressure of $4 \times 10^{-6}$ Pa or less when possible. When the electroluminescent layer 720 is formed after the heat treatment is performed in the vacuum atmosphere, reliability is further improved by keeping the substrate in the vacuum atmosphere until just before the electroluminescent layer 720 is formed. Further, before or after vacuum baking, the anode 718 may be irradiated with ultraviolet rays.

Next, as shown in FIG. 14B, the electroluminescent layer 720 is formed over the anode 718. The electroluminescent layer 720 is formed of one or a plurality of layers. Each layer may contain not only an organic material but also an inorganic material. Luminescence of the electroluminescent layer 720 includes luminescence (fluorescence) at the time of returning to a ground state from a singlet-excited state and luminescence (phosphorescence) at the time of returning to a ground state from a triplet-excited state.

Next, a cathode 721 is formed so as to cover the electroluminescent layer 720. Typically, the cathode 721 can be formed of a metal, an alloy, or a conductive compound, which has a low work function, a mixture of these materials, or the like. Specifically, an alkali metal such as Li or Cs, an alkaline earth metal such as Mg, Ca, or Sr, an alloy containing the aforementioned metal (e.g., Mg:Ag or Al:Li), or a rare earth metal such as Yb or Er can also be used for the cathode 721. Further, when a layer containing a material with a high electron injection property is formed in contact with the cathode 721, a normal conductive film using aluminum, a conductive oxide material, or the like can also be used.

The anode 718, the electroluminescent layer 720, and the cathode 721 overlap with each other in an opening portion of the partition wall 719. The portion where the anode 718, the electroluminescent layer 720, and the cathode 721 overlap with each other corresponds to a light-emitting element 722.

After the light-emitting element 722 is formed, an insulating film may be formed over the cathode 721. For the insulating film, a film that does not easily allow penetration of a substance which may accelerate deterioration of the light-emitting element, such as moisture and oxygen, as compare with other insulating films is used, similarly to the insulating film 716. Typically, for example, a DLC film, a carbon nitride film, or a silicon nitride film formed by an RF sputtering method is preferably used. Alternatively, the film that does not easily allow penetration of the substance such as moisture and oxygen and a film that allows penetration of the substance such as moisture and oxygen more easily than the aforementioned film may be stacked to be used as the insulating film.

Note that FIG. 14B shows the structure in which light emitted from the light-emitting element 722 is emitted to the substrate 700 side; however, a light-emitting element may have a structure in which light is emitted toward the side opposite to the substrate 700.

In practice, after the state shown in FIG. 14B is completed, it is preferable that the light-emitting element be packaged (sealed) in a protection film (e.g., a lamination film or an ultraviolet curable resin film) with high airtightness and less degassing or a light-transmitting cover material in order not to be exposed to the outside air. In this case, when an atmosphere inside the cover material is made an inert atmosphere or a hygroscopic material (e.g., barium oxide) is provided inside the cover material, reliability of the light-emitting element is improved.

(e.g., a bonding film or an ultraviolet-curable resin film) which gets less air circulation or a light-transmitting member This embodiment can be implemented in combination with the aforementioned embodiment modes and embodiments.

Embodiment 5

Figure 15A:
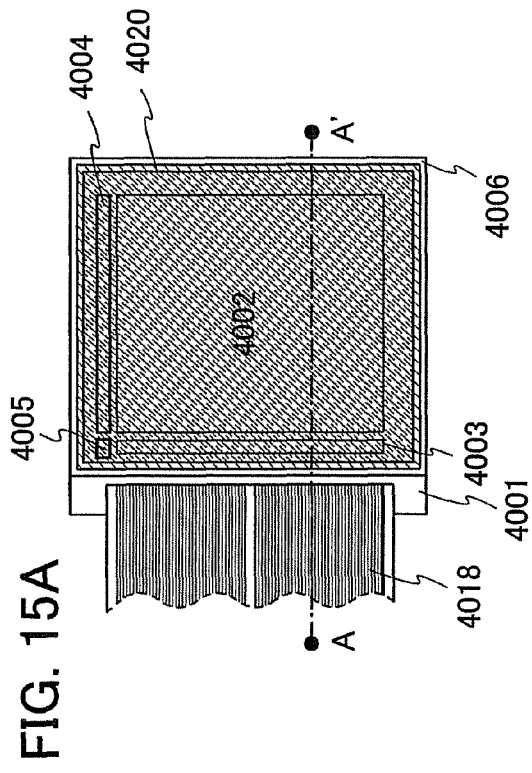
FIG. 15A is a top plan view of a display device of the invention.
Figure 15B:
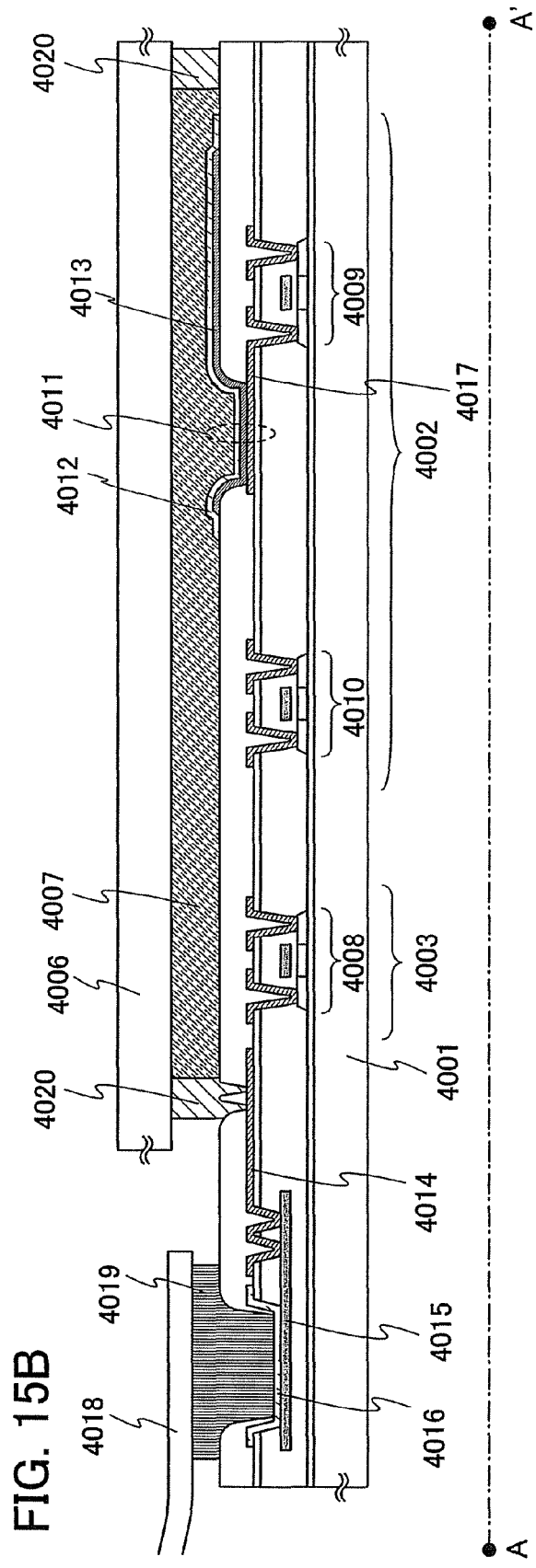
FIG. 15B is a cross-sectional view thereof.

In this embodiment, an external appearance of a light-emitting device, which is a kind of display device of the invention, is described as an example with reference to FIGS. 15A and 15B. FIG. 15A is a top plan view of a panel in which a transistor and a light-emitting element that are formed over a first substrate are sealed between the first substrate and a second substrate by a sealing material. FIG. 15B corresponds to a cross-sectional view along a line A-A' in FIG. 15A.

A sealing material 4020 is provided so as to surround a pixel portion 4002, a signal line driver circuit 4003, a scan line driver circuit 4004, and a voltage generation circuit 4005 which are provided over a first substrate 4001. A second substrate 4006 is provided over the pixel portion 4002, the signal line driver circuit 4003, the scan line driver circuit 4004, and the voltage generation circuit 4005. Accordingly, the pixel portion 4002, the signal line driver circuit 4003, the scan line driver circuit 4004, and the voltage generation circuit 4005 are sealed between the first substrate 4001 and the second substrate 4006 together with a filler 4007 by the sealing material 4020.

Each of the pixel portion 4002, the signal line driver circuit 4003, and the scan line driver circuit 4004 which are provided over the first substrate 4001 includes a plurality of transistors. FIG. 15B illustrates a transistor 4008 included in the signal line driver circuit 4003, and a driving transistor 4009 and a switching transistor 4010 which are included in the pixel portion 4002.

A light-emitting element 4011 uses part of a wiring 4017 connected to a source region or a drain region of the driving transistor 4009 as a pixel electrode. Further, the light-emitting element 4011 includes a counter electrode 4012 and an electroluminescent layer 4013 in addition to the pixel electrode. Note that the structure of the light-emitting element 4011 is not limited to the structure shown in this embodiment. The structure of the light-emitting element 4011 can be changed as appropriate in accordance with a direction of light extracted from the light-emitting element 4011, the polarity of the driving transistor 4009, or the like.

Although various signals and voltage supplied to the signal line driver circuit 4003, the scan line driver circuit 4004, or the pixel portion 4002 are not shown in the cross-sectional view of FIG. 15B, they are supplied from a connection terminal 4016 through leading wirings 4014 and 4015.

In this embodiment, the connection terminal 4016 is formed using the same conductive film as the counter electrode 4012 included in the light-emitting element 4011. The leading wiring 4014 is formed using the same conductive film as the wiring 4017. The leading wiring 4015 is formed using the same conductive film as gate electrodes of the driving transistor 4009, the switching transistor 4010, and the transistor 4008.

The connection terminal 4016 is electrically connected to a terminal included in an FPC 4018 through an anisotropic conductive film 4019.

Glass, metal (typically, stainless steel), ceramic, or plastic can be used for the first substrate 4001 and the second substrate 4006. Note that the second substrate 4006 located in the direction of light extracted from the light-emitting element 4011 needs to have light-transmitting properties. Thus, a light-transmitting material such as a glass plate, a plastic plate, a polyester film, or an acrylic film is preferably used for the second substrate 4006.

In addition, an ultraviolet curable resin or a thermosetting resin can be used for the filler 4007 as well as inert gas such as nitrogen or argon. This embodiment shows an example in which nitrogen is used for the filler 4007.

This embodiment can be implemented in combination with the aforementioned embodiment modes and embodiments.

Embodiment 6

Figure 16A:
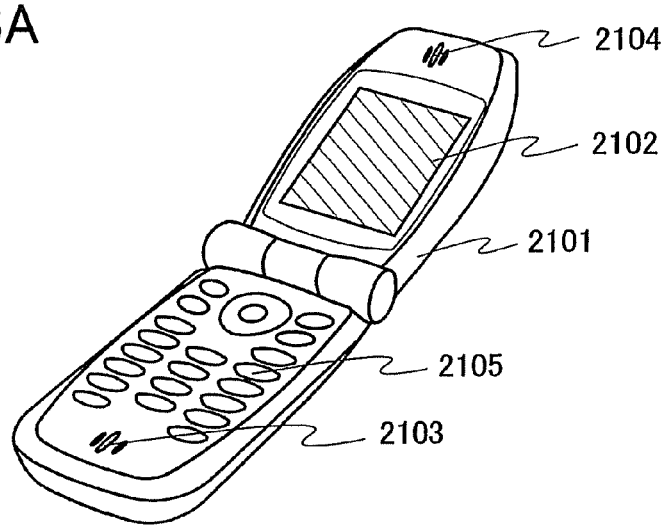
FIGS. 16A to 16C each illustrate an electronic device in which a display device of the invention is used.
Figure 16B:
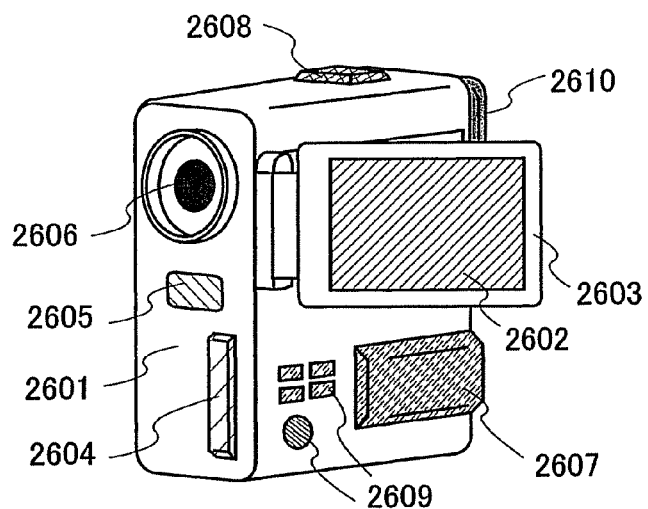
Figure 16C:
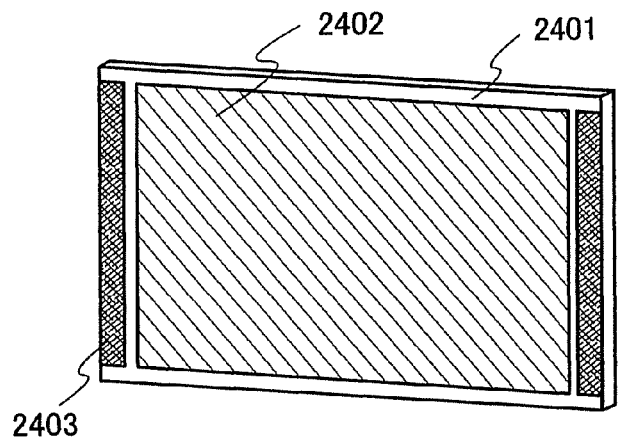
Figure 17A:
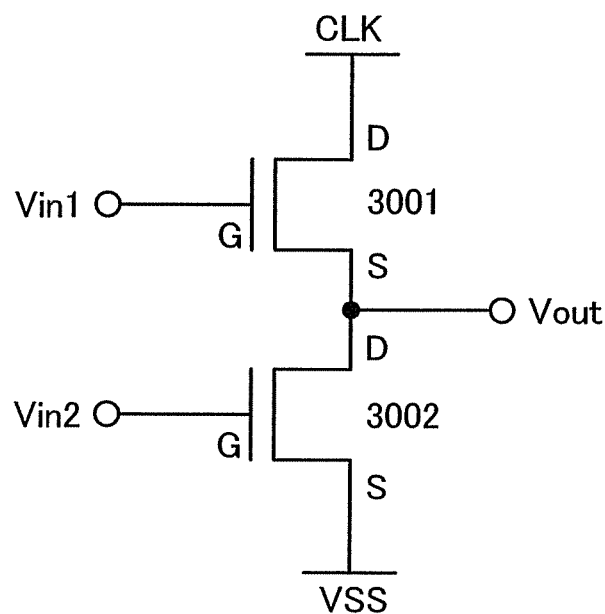
FIG. 17A is a circuit diagram of an output circuit.
Figure 17B:
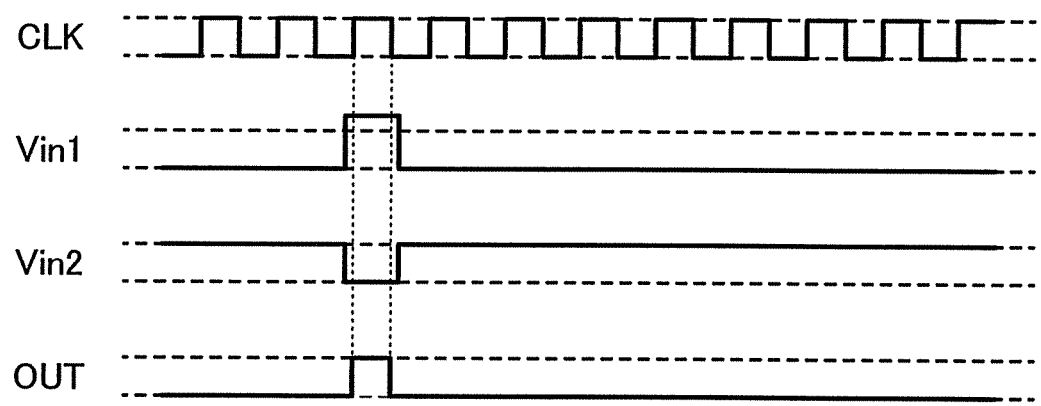
FIG. 17B is a timing chart of the output circuit.

Examples of electronic devices which can use the display device of the invention include a mobile phone, a portable game machine, an electronic book, cameras such as a video camera and a digital still camera, a goggle display (a head mounted display), a navigation system, an audio reproducing device (e.g., a car audio and an audio component set), a notebook computer, and an image reproducing device provided with a recording medium (typically, a device for reproducing a recording medium such as a digital versatile disc (DVD) and having a display for displaying the reproduced image). FIGS. 16A to 16C show specific examples of these electronic devices.

FIG. 16A shows a mobile phone, which includes a main body 2101, a display portion 2102, an audio input portion 2103, an audio output portion 2104, and operation keys 2105. By using the display device of the invention for the display portion 2102, a mobile phone with high reliability can be obtained.

FIG. 16B shows a video camera, which includes a main body 2601, a display portion 2602, a housing 2603, an external connection port 2604, a remote control receiving portion 2605, an image receiving portion 2606, a battery 2607, an audio input portion 2608, operation keys 2609, an eyepiece portion 2610, and the like. By using the display device of the invention for the display portion 2602, a video camera with high reliability can be obtained.

FIG. 16C shows an image display device, which includes a housing 2401, a display portion 2402, a speaker portion 2403, and the like. By using the display device of the invention for the display portion 2402, an image display device with high reliability can be obtained. Note that the image display device refers to any image display device for displaying images, such as those for personal computers, television broadcast reception, and advertisement display.

As described above, the application range of the invention is extremely wide, and the invention can be applied to electronic devices in all fields.

This embodiment can be implemented in combination with the aforementioned embodiment modes and embodiments.

This application is based on Japanese Patent Application serial No. 2007-073754 filed with Japan Patent Office on Mar. 21, 2007, the entire contents of which are hereby incorporated by reference.

What is claimed is:

1. A display device comprising:
   a pixel portion;
   a scan line driver circuit including an output circuit including a transistor; and
   a voltage generation circuit including a decision circuit and a voltage setting circuit,
   wherein the output circuit outputs a second voltage to the pixel portion and the decision circuit when the voltage setting circuit outputs a first voltage to a gate of the transistor,
   wherein the decision circuit controls the voltage setting circuit by comparing a value of the second voltage with a value of the first voltage so that the value of the first voltage is set to a certain value, and
   wherein the transistor is turned on by the certain value.

2. The display device according to claim 1, wherein the transistor is a thin film transistor.

3. The display device according to claim 1, wherein the transistor is a thin film transistor in which an insulating film with a higher dielectric constant than that of silicon oxide is used for a gate insulating film.

4. The display device according to claim 1, wherein the certain value is substantially the same as a minimum value in order to turn on the transistor.

5. A display device comprising:
a pixel portion;
an output circuit including first and second transistors;
a decision circuit; and
a voltage setting circuit,
wherein the output circuit outputs a second voltage to the pixel portion and the decision circuit when the voltage setting circuit outputs a first voltage to a gate of the first transistor,
wherein a clock signal is sampled by the second transistor, and is supplied to the pixel portion,
wherein the decision circuit controls the voltage setting circuit by comparing a value of the second voltage with a value of the first voltage so that the value of the first voltage is set to a certain value, and
wherein the first transistor is turned on by the certain value.

6. The display device according to claim 5, wherein the first transistor is a thin film transistor.

7. The display device according to claim 5, wherein the first transistor is a thin film transistor in which an insulating film with a higher dielectric constant than that of silicon oxide is used for a gate insulating film.

8. The display device according to claim 5, wherein the certain value is substantially the same as a minimum value in order to turn on the first transistor.

9. A display device comprising:
a pixel portion including a plurality of pixels;
an output circuit including first and second transistors;
a decision circuit; and
a voltage setting circuit,
wherein the output circuit outputs a second voltage to the pixel portion and the decision circuit when the voltage setting circuit outputs a first voltage to a gate of the first transistor,
wherein the plurality of pixels are selected per line by sampling a clock signal by the second transistor, and by supplying the clock signal to the pixel portion,
wherein the decision circuit controls the voltage setting circuit by comparing a value of the second voltage with a value of the first voltage so that the value of the first voltage is set to a certain value, and
wherein the first transistor is turned on by the certain value.

10. The display device according to claim 9, wherein the first transistor is a thin film transistor.

11. The display device according to claim 9, wherein the first transistor is a thin film transistor in which an insulating film with a higher dielectric constant than that of silicon oxide is used for a gate insulating film.

12. The display device according to claim 9, wherein the certain value is substantially the same as a minimum value in order to turn on the first transistor.

13. A display device comprising:
a pixel portion;
an output circuit including first and second transistors;
a decision circuit;
a voltage setting circuit; and
an adder included in the voltage setting circuit,
wherein the output circuit outputs a second voltage to the pixel portion and the decision circuit when the voltage setting circuit outputs a first voltage to a gate of the first transistor,
wherein a clock signal is sampled by the second transistor, and is supplied to the pixel portion,
wherein the decision circuit controls the voltage setting circuit by comparing a value of the second voltage with a value of the first voltage so that the value of the first voltage is set to a certain value,
wherein the first transistor is turned on by the certain value, and
wherein the adder applies a sum of the certain value of the first voltage and a value of a third voltage to the gate of the first transistor.

14. The display device according to claim 13, wherein the first transistor is a thin film transistor.

15. The display device according to claim 13, wherein the first transistor is a thin film transistor in which an insulating film with a higher dielectric constant than that of silicon oxide is used for a gate insulating film.

16. The display device according to claim 13, wherein the certain value is substantially the same as a minimum value in order to turn on the first transistor.

17. A display device comprising:
a pixel portion;
an output circuit including first and second transistors;
a decision circuit;
a voltage setting circuit; and
an adder included in the voltage setting circuit,
wherein the output circuit outputs a second voltage to the pixel portion and the decision circuit when the voltage setting circuit outputs a first voltage to a gate of the first transistor,
wherein the plurality of pixels are selected per line by sampling a clock signal by the second transistor, and by supplying the clock signal to the pixel portion,
wherein the decision circuit controls the voltage setting circuit by comparing a value of the second voltage with a value of the first voltage so that the value of the first voltage is set to a certain value,
wherein the first transistor is turned on by the certain value, and
wherein the adder applies a sum of the certain value of the first voltage and a value of a third voltage to the gate of the first transistor.

18. The display device according to claim 17, wherein the first transistor is a thin film transistor.

19. The display device according to claim 17, wherein the first transistor is a thin film transistor in which an insulating film with a higher dielectric constant than that of silicon oxide is used for a gate insulating film.

20. The display device according to claim 17, wherein the certain value is substantially the same as a minimum value in order to turn on the first transistor.

21. The display device according to claim 1,
wherein the decision circuit comprises a storage circuit and a comparison circuit being electrically connected to the storage circuit.

22. The display device according to claim 5,
wherein the decision circuit comprises a storage circuit and a comparison circuit being electrically connected to the storage circuit.

23. The display device according to claim 9,
wherein the decision circuit comprises a storage circuit and a comparison circuit being electrically connected to the storage circuit.

24. The display device according to claim 13,
wherein the decision circuit comprises a storage circuit and a comparison circuit being electrically connected to the storage circuit.

25. The display device according to claim 17,
wherein the decision circuit comprises a storage circuit and a comparison circuit being electrically connected to the storage circuit.

26. The display device according to claim 1,
wherein the scan line driver circuit and the voltage generation circuit are not included in the pixel portion.

* * * * *